US010044002B2

(12) United States Patent
Lee et al.

(10) Patent No.: US 10,044,002 B2
(45) Date of Patent: Aug. 7, 2018

(54) DISPLAY DEVICE

(71) Applicant: Samsung Display Co., Ltd., Yongin-si, Gyeonggi-Do (KR)

(72) Inventors: Dae-Woo Lee, Hwaseong-si (KR);
Shin-Moon Kang, Seoul (KR);
Byoung-Ki Kim, Seoul (KR);
Hee-Kyung Kim, Busan (KR);
Hyun-Chul Son, Asan-si (KR);
Ji-Hoon Song, Osan-si (KR);
Yeon-Sung Lee, Suwon-si (KR);
Yun-Mo Chung, Yongin-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 15/406,141

(22) Filed: Jan. 13, 2017

(65) Prior Publication Data
US 2017/0214003 A1   Jul. 27, 2017

(30) Foreign Application Priority Data
Jan. 22, 2016 (KR) .................. 10-2016-0008024

(51) Int. Cl.
*H01L 51/52* (2006.01)
*H01L 27/32* (2006.01)
(Continued)

(52) U.S. Cl.
CPC ........ *H01L 51/5271* (2013.01); *H01L 27/326* (2013.01); *H01L 27/3234* (2013.01);
(Continued)

(58) Field of Classification Search
CPC ............. H01L 51/5271; H01L 51/5237; H01L 51/5262; H01L 27/1214; H01L 27/3258; H01L 27/3262; H01L 27/3234; H01L 27/326; H04N 5/2257; G02F 1/133555; G02F 1/133553; G02F 1/133557
(Continued)

(56) References Cited

U.S. PATENT DOCUMENTS

2002/0005928 A1*  1/2002  Hanakawa ........ G02F 1/133555
                                              349/149

FOREIGN PATENT DOCUMENTS

KR   10-2014-0073216 A   6/2014
KR   10-2015-0003466 A   1/2015

\* cited by examiner

*Primary Examiner* — Johannes P Mondt
(74) *Attorney, Agent, or Firm* — Innovation Counsel, LLP

(57) ABSTRACT

A display device includes a display panel and a camera module. The display panel displays an image on a first surface, and includes a first substrate, a sub-pixel structure, a reflection pattern, and a transflective reflection pattern. The first substrate included a plurality of pixel regions each having sub-pixel regions, a transparent region, and a reflection region surrounding the sub-pixel regions and the transparent region. The second substrate is disposed on the sub-pixel structure. The reflection pattern is disposed in the reflection region on the second substrate, and exposes the sub-pixel regions and the transparent region. The transflective reflection pattern is disposed on the second substrate, and has an opening exposing at least a portion of at least one transparent region among the transparent regions. The camera module is disposed in the second surface on the display panel, and the second surface is opposite to the first surface.

20 Claims, 24 Drawing Sheets

(51) Int. Cl.
*H04N 5/225* (2006.01)
*H01L 27/12* (2006.01)
(52) U.S. Cl.
CPC ...... *H01L 27/3258* (2013.01); *H01L 27/3262* (2013.01); *H01L 51/5237* (2013.01); *H01L 51/5262* (2013.01); *H04N 5/2257* (2013.01); *H01L 27/1214* (2013.01)
(58) Field of Classification Search
USPC .......................................................... 257/72
See application file for complete search history.

DISPLAY DEVICE

CROSS-REFERENCE TO RELATED APPLICATION(S)

This application claims priority under 35 USC § 119 to Korean Patent Applications No. 10-2016-0008024 filed on Jan. 22, 2016 in the Korean Intellectual Property Office (KIPO), the contents of which are incorporated herein in its entirety by reference.

BACKGROUND

1. Field

This disclosure relates generally to display devices. More particularly, embodiments of the present inventive concept relate to display devices including a reflection pattern.

2. Description of the Related Art

A flat panel display (FPD) device is widely used as a display device of an electronic device because the FPD device is lightweight and thin compared to a cathode-ray tube (CRT) display device. Typical examples of FPD devices are a liquid crystal display (LCD) device and an organic light emitting display (OLED) device. Recently, a display device (e.g., the OLED device or the LCD device) capable of displaying an image and reflecting an image of an object that is disposed in front of the display device may have been developed.

Meanwhile, the display device may include a camera module such that the functions of a video call and a video conference, a video recording, etc. are operated using an image that is recorded by the camera module. Generally, the camera module is disposed in a border (or, edge) of the display device. However, the target object being recorded is usually closer to the center area of the display device. As such, the camera module may not squarely capture the target object that is disposed in front of the display device correctly. The target object could appear off-center in the captured image or, in the case of a video conference, the captured image of a user shows the user looking at "somewhere else," not at the camera because the user is looking at the display region instead of the camera at the border of the display device. As a result, the captured image may be unnatural or unsatisfying.

SUMMARY

Some example embodiments provide a display device including a reflection pattern.

According to some aspect of example embodiments, a display device includes a display panel and a camera module. The display panel displays an image on a first surface, and includes a first substrate, a sub-pixel structure, a reflection pattern, and a transflective reflection pattern. The first substrate included a plurality of pixel regions each having sub-pixel regions, transparent regions, and a reflection region surrounding the sub-pixel regions and the transparent regions. The sub-pixel structure is disposed in each of the sub-pixel regions on the first substrate. The second substrate is disposed on the sub-pixel structure. The reflection pattern is disposed in the reflection region on the second substrate, and exposes the sub-pixel regions and the transparent regions. The transflective reflection pattern is disposed on the second substrate, and has an opening exposing at least a portion of at least one transparent region among the transparent regions included in a plurality of the pixel regions. The camera module is disposed in the second surface on the display panel, and the second surface is opposite to the first surface.

In example embodiments, the opening is disposed in a region corresponding to a portion where the camera module is positioned.

In example embodiments, a thickness of the transflective reflection pattern may be less than a thickness of the reflection pattern, and a light transmissivity of the transflective reflection pattern may be greater than a light transmissivity of the reflection pattern.

In example embodiments, the reflection pattern and the transflective reflection pattern may be disposed between the second substrate and the sub-pixel structure, and the reflection pattern may be interposed between the second substrate and the transflective reflection pattern.

In example embodiments, the reflection pattern and the transflective reflection pattern may be disposed between the second substrate and the sub-pixel structure, and the transflective reflection pattern may be interposed between the second substrate and the reflection pattern.

In example embodiments, the reflection pattern and the transflective reflection pattern may be disposed on the first surface of the second substrate, and the reflection pattern may be interposed between the second substrate and the transflective reflection pattern.

In example embodiments, the reflection pattern and the transflective reflection pattern may be disposed on the first surface of the second substrate, and the transflective reflection pattern may be interposed between the second substrate and the reflection pattern.

In example embodiments, the display panel may include a center region and a peripheral region surrounding the center region. The camera module may be disposed in the center region or the peripheral region.

In example embodiments, the camera module may be disposed in the center region, and the transflective reflection pattern that is located in the transparent regions corresponding to the center region may have an opening that exposes at least a portion of the transparent regions.

In example embodiments, the camera module may capture an image of an object that is located in front of the first surface of the display panel via the transparent regions of the display panel.

In example embodiments, the display device may further include a body surrounding the display panel and the camera module.

In example embodiments, the body may hold the camera module that is located in the second surface on the display panel.

In example embodiments, the display device may further include a moving member. The moving member may be coupled to the camera module, and may be configured to move the camera module on the second surface of the display panel.

In example embodiments, the transflective reflection pattern may have an opening that exposes at least a portion of the transparent regions.

In example embodiments, the display device may further include a body surrounding the display panel, the camera module, and the moving member.

In example embodiments, the sub-pixel structure may include a semiconductor element on the first substrate, a lower electrode on the semiconductor element, a light emitting layer on the lower electrode, and an upper electrode on the light emitting layer.

In example embodiments, the upper electrode may expose the transparent regions.

In example embodiments, the semiconductor element may include an active layer, a gate electrode, a source electrode and a drain electrode. The active layer may be disposed on the first substrate, and may include source and drain regions. The gate electrode may be disposed on the active layer. The source electrode may be disposed on the gate electrode, and may be in contact with the source region of the active layer. The drain electrode may be spaced apart from the source electrode, and may be in contact with the drain region of the active layer.

In example embodiments, the semiconductor element may further include a gate insulation layer, an insulating interlayer, and a planarization layer. The gate insulation layer may be disposed on the first substrate. The gate insulation layer may cover the active layer in the sub-pixel region and, may expose the transparent regions. The insulating interlayer may be disposed on the gate insulation layer. The insulating interlayer may cover the gate electrode in the sub-pixel region, and may expose the transparent regions. The planarization layer may be disposed on the insulating interlayer. The planarization layer may cover the source and drain electrodes in the sub-pixel region, and may expose the transparent regions.

In example embodiments, a portion of the first substrate that is exposed by the gate insulation layer, the insulating interlayer, and the planarization layer in the transparent regions may be defined as a transparent window of the transparent regions.

As the display device according to example embodiments includes the reflection pattern, transflective reflection pattern having an opening, the display panel including a transparent window of the transparent region, and the camera module that is positioned in a lower surface on the display panel, the display device may reflect or film an image of an object located above the front of the display device. Accordingly, the display device may squarely capture an image of an object located in front of the display device, and may capture an image that has improved definition via the opening of the transflective reflection pattern.

BRIEF DESCRIPTION OF THE DRAWINGS

Example embodiments can be understood in more detail from the following description taken in conjunction with the accompanying drawings, in which.

DETAILED DESCRIPTION OF THE EMBODIMENTS

Hereinafter, embodiments of the present inventive concept will be explained in detail with reference to the accompanying drawings.

Figure 1:
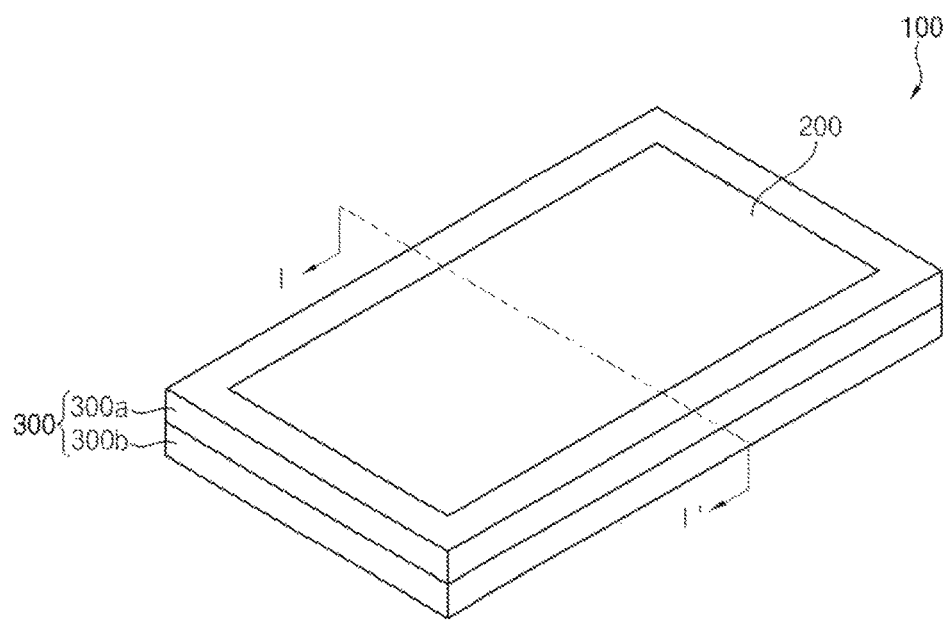
FIG. 1 is a perspective view illustrating a front surface of a display device in accordance with example embodiments.
Figure 2:
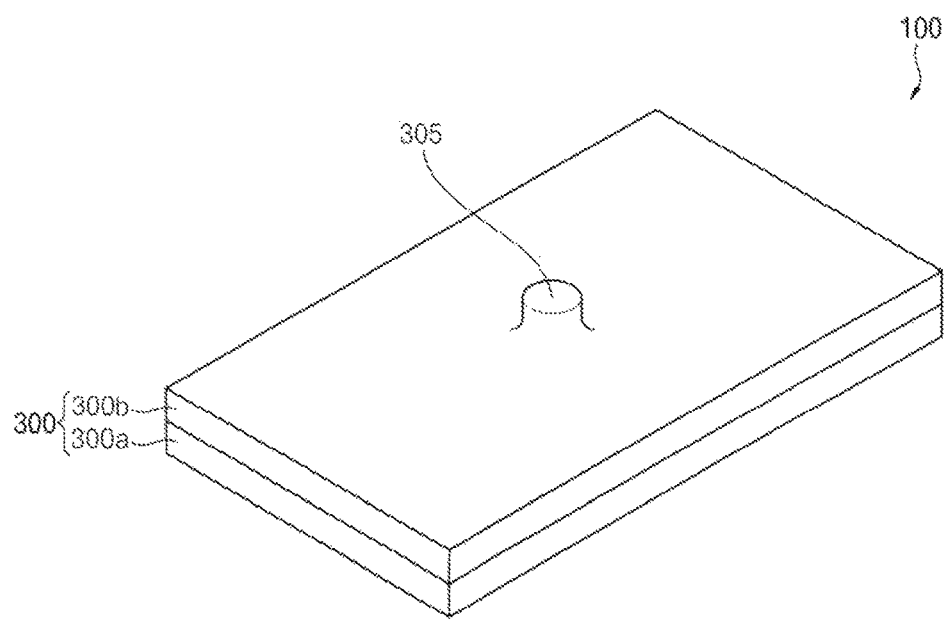
FIG. 2 is a perspective view illustrating a rear surface of the display device of FIG. 1.
Figure 3:
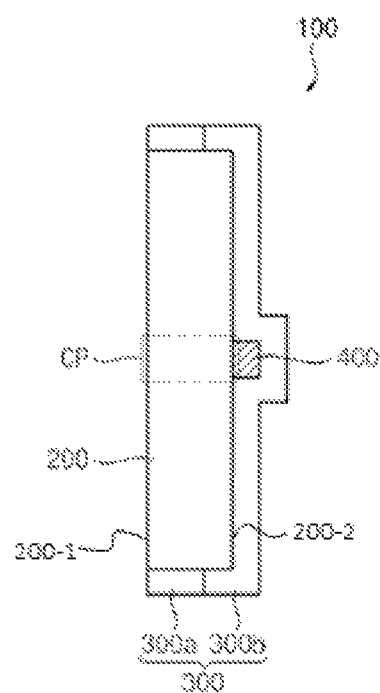
FIG. 3 is a cross-sectional view taken along a line I-I' of FIG. 1.
Figure 4:
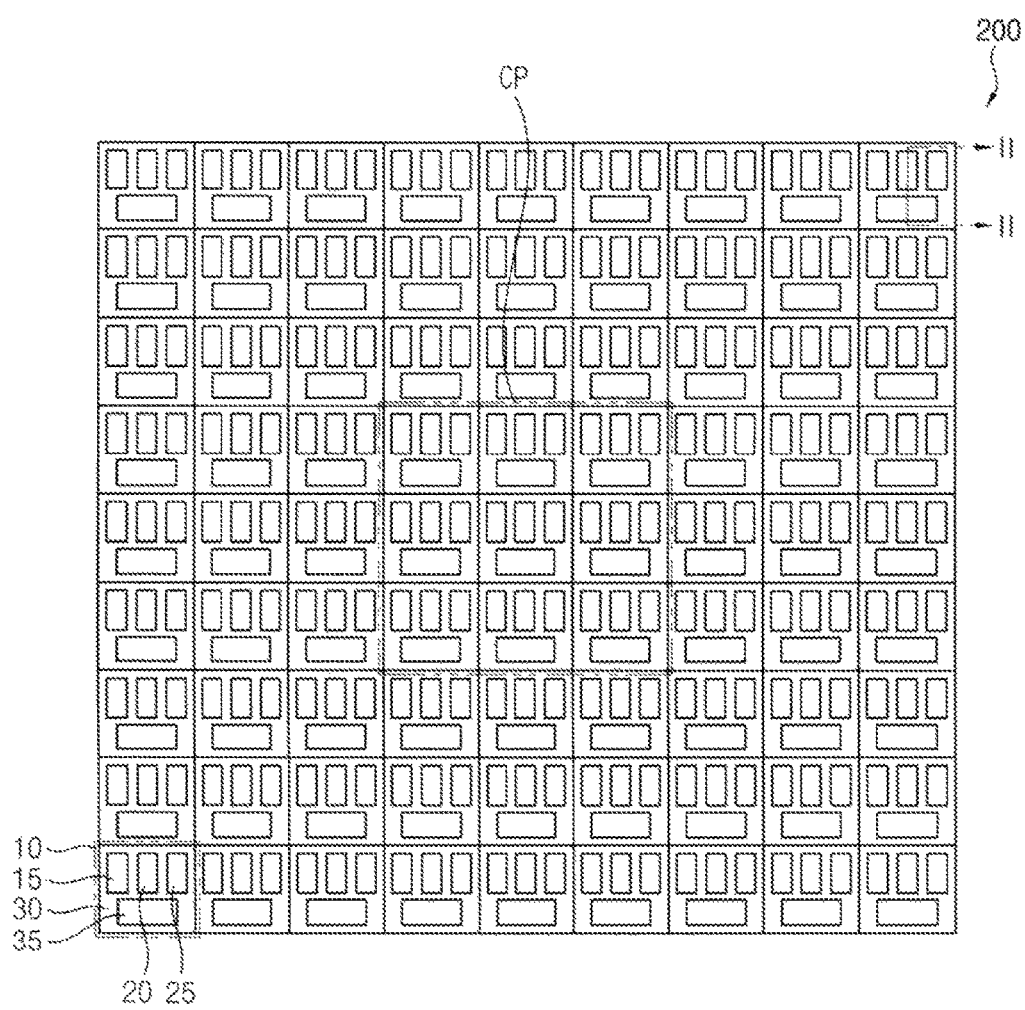
FIG. 4 is a planar view for describing a display panel included in the display device of FIG. 1.
Figure 5:
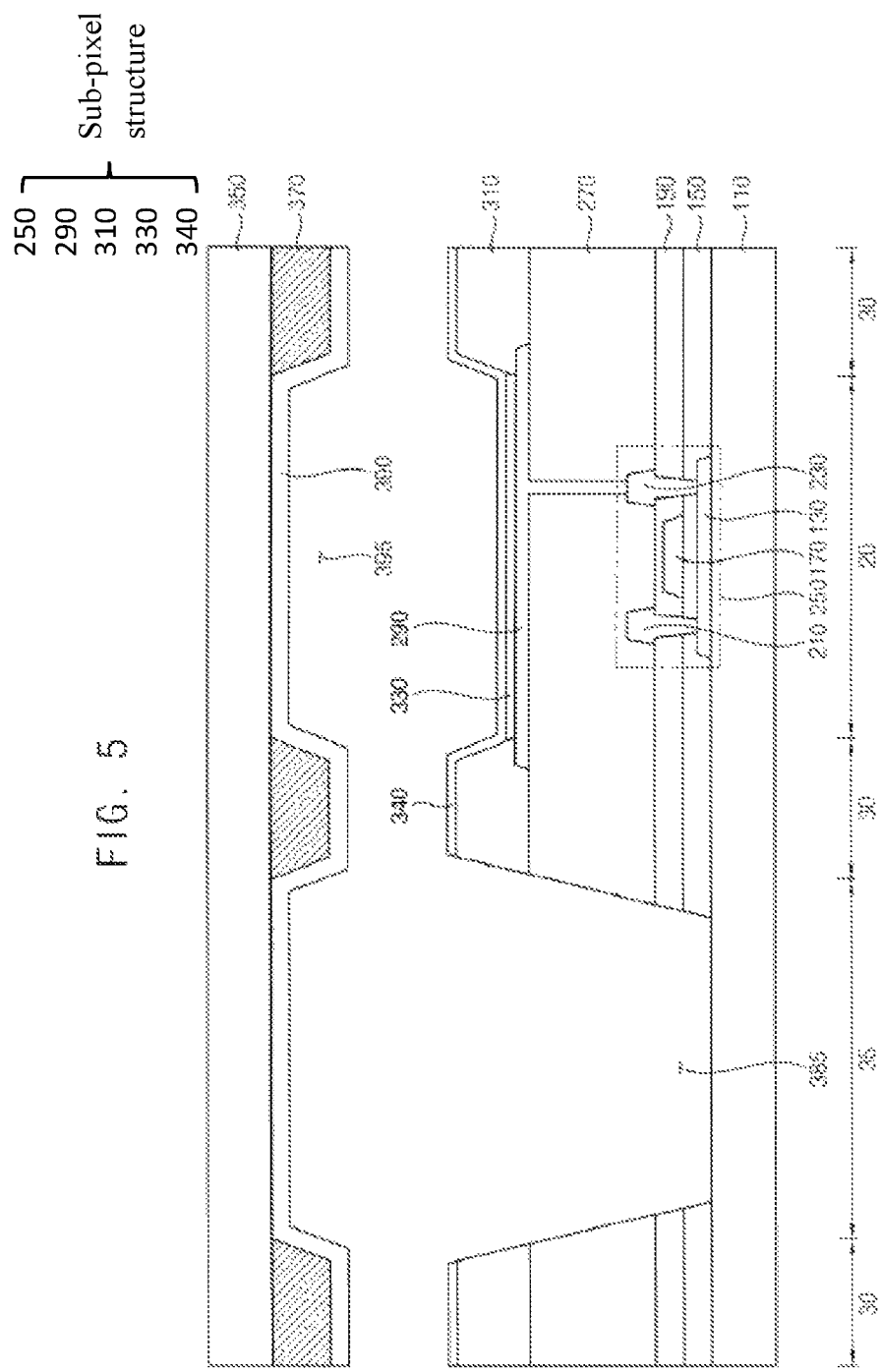
FIG. 5 is a cross-sectional view taken along a line II-II' of FIG. 4.
Figure 6:
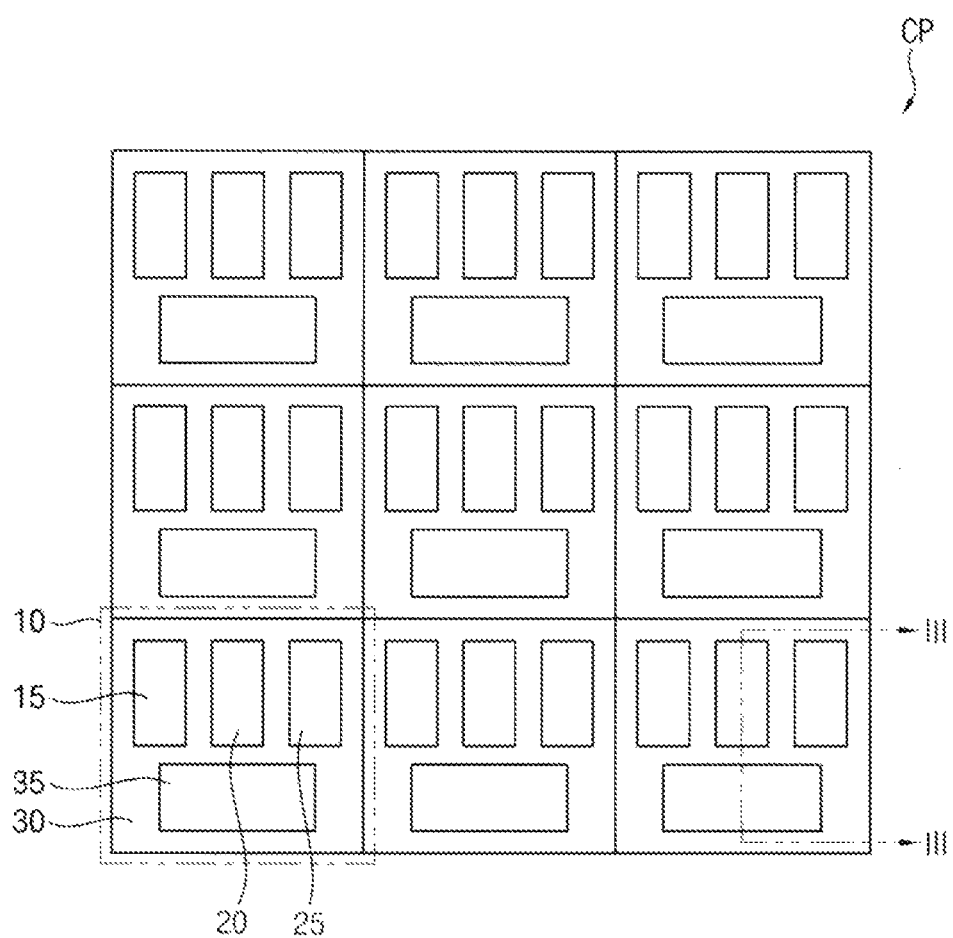
FIG. 6 is an enlarged planar view corresponding to region 'CP' of FIG. 4.
Figure 7:
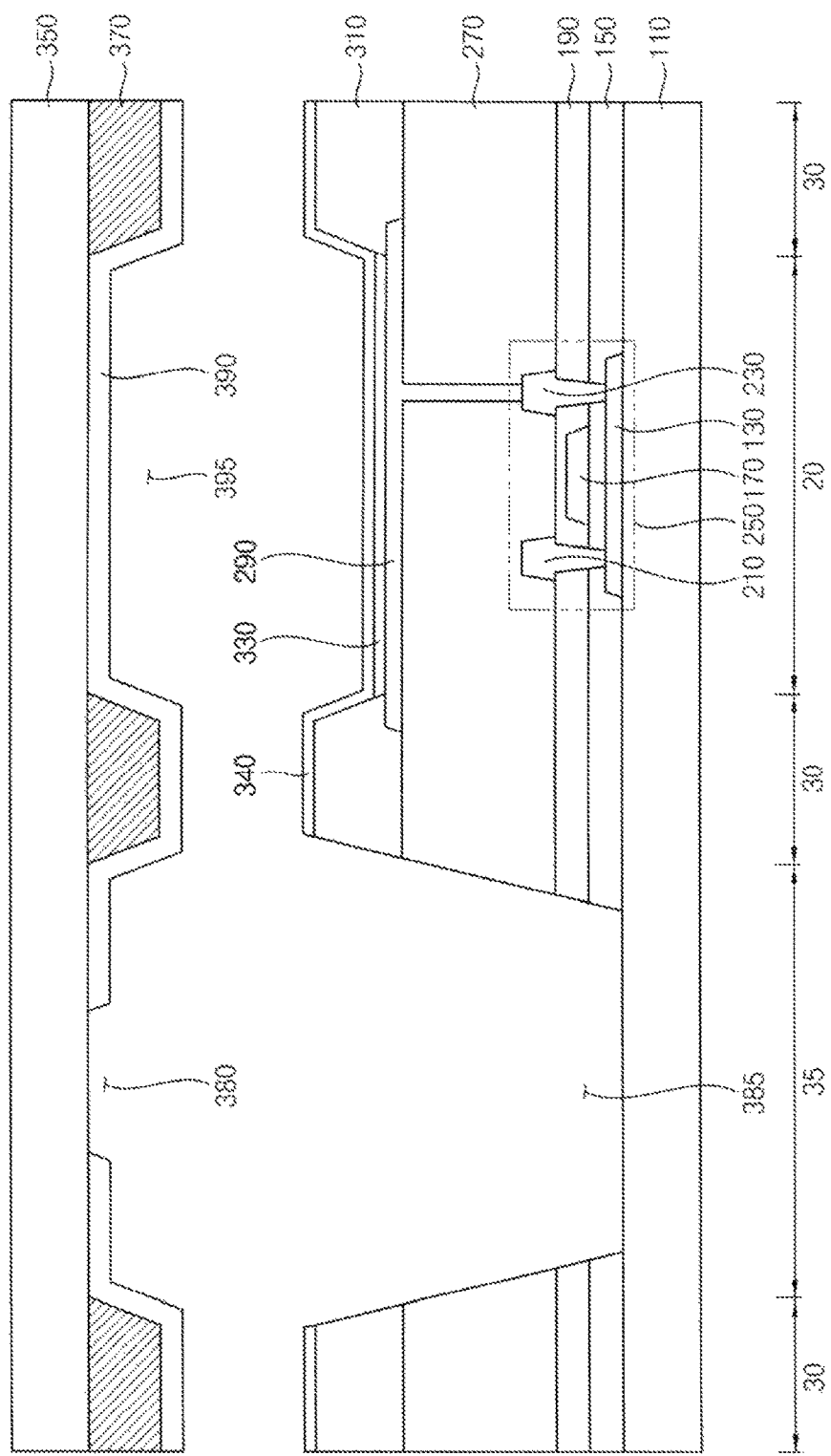
FIG. 7 is a cross-sectional view taken along a line III-III' of FIG. 6.
Figure 8:
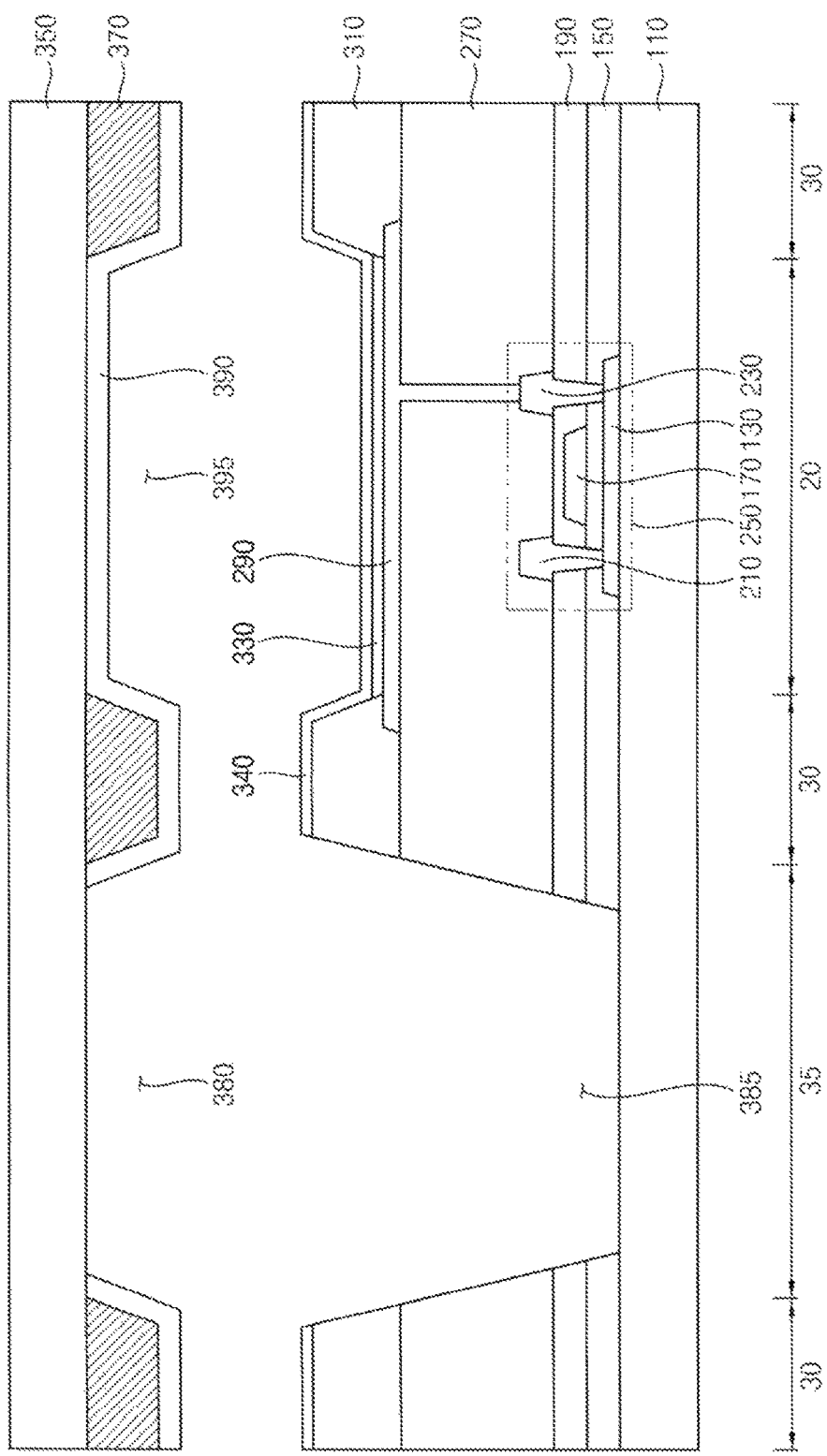
FIG. 8 is a cross-sectional view illustrating an example of a display panel included in the display device of FIG. 1.

FIG. 1 is a perspective view illustrating a front surface of a display device in accordance with example embodiments, and FIG. 2 is a perspective view illustrating a rear surface of the display device of FIG. 1. FIG. 3 is a cross-sectional view taken along a line I-I' of FIG. 1, and FIG. 4 is a planar view for describing a display panel included in the display device of FIG. 1. FIG. 5 is a cross-sectional view taken along a line II-II' of FIG. 4, and FIG. 6 is an enlarged planar view corresponding to region 'CP' of FIG. 4. FIG. 7 is a cross-sectional view taken along a line III-III' of FIG. 6, and FIG. 8 is a cross-sectional view illustrating an example of a display panel included in the display device of FIG. 1.

Referring to FIGS. 1, 2, 3, 4, 5, 6, and 7, a display device 100 may include a display panel 200, a camera module 400, a body 300, etc. Here, the display panel 200 may include a first substrate 110, a sub-pixel structure, a second substrate 350, a reflection pattern 370, a transflective reflection pattern 390, etc. In example embodiments, the display panel 200 may include a plurality of pixel regions 10. One pixel region 10 among a plurality of the pixel regions 10 may include first, second, and third sub-pixel regions 15, 20, and 25, a transparent region 35, and a reflection region 30. Here, the display panel 200 may include a center region CP and a peripheral region surrounding the center region CP. For example, as illustrated in FIGS. 3 and 4, the camera module 400 may be positioned in the center region CP. The transflective reflection pattern 390 that is located in the center region CP may have an opening that exposes at least a portion of the transparent region 35, and the transflective reflection pattern 390 that is located in the peripheral region may not have an opening in the transparent region 35. That is, the transflective reflection pattern 390 that is located in the peripheral region may be entirely disposed in the transparent region 35.

In some example embodiments, when the camera module 400 is positioned in a portion of the peripheral region, the transflective reflection pattern 390 that is located in the transparent region 35 corresponding to a portion where the camera module 400 is positioned may have an opening that exposes at least a portion of the transparent region 35. In addition, the transflective reflection pattern 390 that is located in the transparent region 35 corresponding to a portion where the camera module 400 is not positioned may not have an opening.

As the display device 100 includes the reflection region 30, the display device 100 may reflect an image of an object that is located in front of the display device 100. In addition, as the display device 100 includes the transparent region 35, the camera module 400 may capture an image of an object that is located in front of the display device 100 via the transparent region 35.

Referring again to FIGS. 1, 2, and 3, the camera module 400 may be disposed between the display panel 200 and the body 300, and the body 300 may surround the display panel 200 and the camera module 400.

A first surface 200-1 of the display panel 200, which is the "front" part of the display device 100, may display an image. A second surface 200-2 of the display panel 200, which is opposite the first surface 200-1, may be in contact with the camera module 400. Referring to FIG. 3, the left side is herein referred to as the "front side", and the right side is herein referred to as the "rear side." As illustrated in FIGS. 4 and 5, the display device 100 (e.g., the display panel 200) may include a plurality of pixel regions 10. One pixel region 10 among a plurality of the pixel regions 10 may include the first, second, and third sub-pixel regions 15, 20, and 25, the transparent region 35, and the reflection region 30. For example, a plurality of the pixel regions 10 each may have the first, second, and third sub-pixel regions 15, 20, and 25, the transparent region 35, and the reflection region 30. The reflection region 30 may substantially surround the first, second, and third sub-pixel regions 15, 20 and 25, and the transparent region 35. In example embodiments, each pixel region 10 may have its own transparent region 35. However, this is not a limitation of the inventive concept. For example, in some example embodiments, a plurality of pixel regions 10 may share one transparent region 35 that extends across neighboring pixel regions 10.

Referring again to FIGS. 4, 5, 6 and 7, in the display panel 200, first, second, and third sub-pixels may be disposed in the first, second, and third sub-pixel regions 15, 20, and 25, respectively. For example, the first sub-pixel may emit light of a red color, and second sub-pixel may emit light of a green color. In addition, the third sub-pixel may emit light of a blue color. The first, second, and third sub-pixels (e.g., sub-pixel structure) may be located at the same level on the first substrate 110.

The reflection pattern 370 may be disposed in the reflection region 30. For example, the reflection pattern 370 may reflect external light, and may have a mesh shape including a plurality of openings in areas corresponding to the sub-pixel regions. The reflection pattern 370 may include openings 395 that are located in areas corresponding to the first, second, and third sub-pixel regions 15, 20 and 25, and transparent region 35. A size of the first, second, and third sub-pixel regions 15, 20 and 25 each may be substantially the same as that of the openings 395 each of the reflection pattern 370 that is located in areas corresponding to the first, second, and third sub-pixel regions 15, 20 and 25. In addition, a size of the transparent region 35 may be substantially the same as that of the openings 395 each of the reflection pattern 370 that is located in areas corresponding to the transparent region 35.

A transparent window 385 may be located in the transparent region 35. The camera module 400 that is positioned on the second surface of the display panel 200 may obtain an image of an object that is located in front of the first surface of the display panel 200 via the transparent region 35. That is, the transparent region 35 may be transparent, and the sub-pixel structure may not be disposed in the transparent region 35. As illustrated in FIGS. 5 and 7, the display device 100 may include the first substrate 110, the sub-pixel structure, the second substrate 350, the reflection pattern 370, the transflective reflection pattern 390, etc. Here, the sub-pixel structure may include a semiconductor element 250, a lower electrode 290, a pixel defining layer 310, a light emitting layer 330, and an upper electrode 340. In addition, the semiconductor element 250 may include an active layer 130, a gate insulation layer 150, a gate electrode 170, an insulating interlayer 190, a source electrode 210, a drain electrode 230, and a planarization layer 270.

The semiconductor element 250, the lower electrode 290, the light emitting layer 330, etc may be disposed in the sub-pixel region 20. The pixel defining layer 310, the reflection pattern 370, etc may be disposed in the reflection region 30. The transparent window 385 may be located in the transparent region 35. The transflective reflection pattern 390 may be disposed in the sub-pixel region 20, the reflection region 30, and the transparent region 35. In example embodiments, the transflective reflection pattern 390 may have an opening 380 that exposes at least a portion of the transparent region 35 in the center region CP as illustrated in FIG. 7, and For example, an image may be displayed in the sub-pixel region 20, and an image of an object that is located in front of the display device 100 may be reflected in the reflection region 30. As the display device 100 includes the reflection pattern 370 and the transflective reflection pattern 390, the display device 100 may serve as a mirror display device. In addition, the display device 100 may serve as a display device having the camera module 400 capable of squarely capturing an image of an object that is located in the front of the display device 100 via the transparent region 35. Accordingly, the camera module 400 of the display device 100 may obtain an image of a user "looking at" the camera. Further, as the opening 380 is formed in the transflective reflection pattern 390 that is located in the transparent region 35 corresponding to a portion where the camera module 400 is positioned, the camera module 400 of the display device 100 may capture an image that has improved definition (or, improved image quality, improved visibility)

Referring to FIGS. 5 and 7, the first substrate 110 may be provided. The first substrate 110 may be formed of transparent materials. For example, the first substrate 110 may include a quartz substrate, a synthetic quartz substrate, a calcium fluoride substrate, a fluoride-doped quartz substrate, a sodalime glass substrate, a non-alkali substrate etc. Alternatively, the first substrate 110 may be formed of a flexible transparent material such as a flexible transparent resin substrate (e.g., a polyimide substrate). For example, the polyimide substrate may include a first polyimide layer, a barrier film layer, a second polyimide layer, etc. Since the polyimide substrate is relatively thin and flexible, the polyimide substrate may be disposed on a rigid glass substrate which may support the polyimide substrate during the formation of the sub-pixel structure. That is, the first substrate 110 may have a structure in which the first polyimide layer, the barrier film layer and the second polyimide layer are stacked on the rigid glass substrate. In manufacturing the display device 100, after an insulating layer (e.g., a buffer layer) is provided on the second polyimide layer of the polyimide substrate, the sub-pixel structure may be disposed on the insulating layer. After the sub-pixel structure is formed on the insulating layer, the rigid glass substrate on which the polyimide substrate is disposed may be removed. It may be difficult to form the sub-pixel structure directly on the polyimide substrate because the polyimide substrate is relatively thin and flexible. Accordingly, the sub-pixel structure is formed on the polyimide substrate which is disposed on the rigid glass substrate, and then the polyimide substrate may serve as the first substrate 110 of the display device 100 after the removal of the rigid glass substrate. As the display device 100 includes the sub-pixel region 20, reflection region 30, and transparent region 35, the first substrate 110 may also include the sub-pixel region 20, the reflection region 30, and the transparent region 35.

A buffer layer (not shown) may be disposed on the first substrate 110. The buffer layer may be disposed on the entire first substrate 110. The buffer layer may prevent the diffusion of metal atoms and/or impurities from the first substrate 110 into the sub-pixel structure. Additionally, the buffer layer may control heat conductivity in a crystallization process for forming the active layer 130, thereby obtaining a substantially uniform active layer. Furthermore, the buffer layer may improve a surface flatness of the first substrate 110 when a surface of the first substrate 110 is relatively irregular. According to a type of the first substrate 110, at least two buffer layers may be provided on the first substrate 110, or the buffer layer may not be disposed. For example, the buffer layer may include organic materials or inorganic materials.

The active layer 130 may be disposed in the sub-pixel region 20 on the first substrate 110, and may include source and drain regions. The active layer 130 may be formed of an oxide semiconductor, an inorganic semiconductor (e.g., amorphous silicon, polysilicon, etc.), an organic semiconductor, etc.

The gate insulation layer 150 may be disposed on the active layer 130. The gate insulation layer 150 may cover the active layer 130 in the sub-pixel region 20 on the first substrate 110, and may expose the transparent region 35. That is, the gate insulation layer 150 may not be disposed in the transparent region 35 on the first substrate 110. In example embodiments, the gate insulation layer 150 may sufficiently cover the active layer 130 in the sub-pixel region 20, and may have a substantially even surface without a step around the active layer 130. Alternatively, the gate insulation layer 150 may cover the active layer 130 in the sub-pixel region 20, and may be disposed as a substantially uniform thickness along a profile of the active layer 130. The gate insulation layer 150 may include a silicon compound, a metal oxide, etc.

The gate electrode 170 may be disposed on the gate insulation layer 150. The gate electrode 170 may be disposed on the active layer 130 in the sub-pixel region 20 with a gate insulating layer 150 interposed between the active layer 130 and the gate electrode 170. The gate electrode 170 may include a conductor such as a metal, a metal alloy, metal nitride, conductive metal oxide, transparent conductive materials, etc. These may be used alone or in a suitable combination thereof. Alternatively, the gate electrode 170 may have a multi-layered structure having a plurality of layers.

The insulating interlayer 190 may be disposed on the gate electrode 170. The insulating interlayer 190 may cover the gate electrode 170 in the sub-pixel region 20 on the gate insulation layer 150, and may expose the transparent region 35. That is, the insulating interlayer 190 may not be disposed in the transparent region 35 on the first substrate 110. In example embodiments, the insulating interlayer 190 may sufficiently cover the gate electrode 170 in the sub-pixel region 20, and may have a substantially even surface without a step around the gate electrode 170. Alternatively, the insulating interlayer 190 may cover the gate electrode 170 in the sub-pixel region 20, and may be disposed as a substantially uniform thickness along a profile of the gate electrode 170. The insulating interlayer 190 may include a silicon compound, a metal oxide, etc.

The source electrode 210 and the drain electrode 230 may be disposed in the sub-pixel region 20 on the insulating interlayer 190. The source electrode 210 may be in contact with the source region of the active layer 130 via a contact hole formed by removing a portion of the gate insulation layer 150 and the insulating interlayer 190. The drain electrode 230 may be in contact with the drain region of the active layer 130 via a contact hole formed by removing a portion of the gate insulation layer 150 and the insulating interlayer 190. Each of the source electrode 210 and the drain electrode 230 may include a conductor such as a metal, an alloy, metal nitride, conductive metal oxide, transparent conductive materials, etc. These may be used alone or in a suitable combination thereof. Alternatively, each of the source electrode 210 and the drain electrode 230 may have a multi-layered structure having a plurality of layers. Accordingly, the semiconductor element 250 including the active layer 130, the gate insulation layer 150, the gate electrode 170, the insulating interlayer 190, the source electrode 210, and the drain electrode 230 may be disposed on the first substrate in the sub-pixel region.

In example embodiments, the semiconductor element 250 of the display device 100 has a top gate structure, although the inventive concept is not limited thereto. For example, in some example embodiments, the semiconductor element 250 may have a bottom gate structure. In addition, the semiconductor element 250 of the display device 100 is disposed in the sub-pixel region 20, although the inventive concept is not limited thereto. For example, the semiconductor element 250 may be disposed in the reflection region 30.

The planarization layer 270 may be disposed on the source electrode 210 and the drain electrode 230. The planarization layer 270 may cover the source electrode 210 and the drain electrode 230 in the sub-pixel region 20 on the insulating interlayer 190, without covering the transparent region 35. That is, the planarization layer 270 may not be disposed in the transparent region 35 on the first substrate 110. In example embodiments, the planarization layer 270 may have a thickness enough to sufficiently cover the source electrode 210 and the drain electrode 230 in the sub-pixel region 20. In this case, the planarization layer 270 may have a substantially even upper surface when it is formed, and a planarization process may be further performed on the planarization layer 270 to form the even upper surface when the planarization layer 270 does not have a substantially even upper surface when it is formed. Alternatively, the planarization layer 270 may cover the source electrode 210 and the drain electrode 230 in the sub-pixel region 20, and may be disposed at a substantially uniform thickness along a profile of the source electrode 210 and the drain electrode 230. The planarization layer 270 may include organic materials or inorganic materials. For example, the planarization layer 270 may include inorganic materials such as silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc. Alternatively, the planarization layer 270 may include organic materials such as a photoresist, a polyacryl-based resin, a polyimide-based resin, a polyamide-based resin, a siloxane-based resin, an acryl-based resin, an epoxy-based resin, etc.

The lower electrode 290 may be disposed in the sub-pixel region 20 on the planarization layer 270. The lower electrode 290 may be in contact with the drain electrode 230 via a contact hole formed by removing a portion of the planarization layer 270. In addition, the lower electrode 290 may be electrically connected to the semiconductor element 250. The lower electrode 290 may include a conductor such as a metal, a metal alloy, metal nitride, conductive metal oxide, transparent conductive materials, etc. These may be used alone or in a suitable combination thereof. Alternatively, the lower electrode 290 may have a multi-layered structure having a plurality of layers.

The pixel defining layer 310 may be disposed in the reflection region 30 on the planarization layer 270, and may expose a portion of the lower electrode 290. In addition, the pixel defining layer 310 may expose the transparent region 35. That is, the pixel defining layer 310 may not be disposed in the transparent region 35 on the first substrate 110. The light emitting layer 330 may be disposed on the lower electrode 290 that is exposed by the pixel defining layer 310 in the sub-pixel region 20. As the gate insulation layer 150, the insulating interlayer 190, the planarization layer 270, and the pixel defining layer 310 are removed in the transparent region 35, the transparent window 385 may be formed in the transparent region 35. The pixel defining layer 310 may be formed of organic materials or inorganic materials. Alternatively, the transparent window 385 may not be formed in the transparent region 35 of the display device 100. For example, the gate insulation layer 150, the insulating interlayer 190, the planarization layer 270, the pixel defining layer 310, and the upper electrode 340 may be disposed in the transparent region 35, and metal wirings (e.g., scan signal wirings, data signal wirings, initialization signal wirings, emission signal wirings, power supply voltage wiring, etc) and the semiconductor element 250 may not be disposed in the transparent region 35.

The light emitting layer 330 may be disposed on a portion of the lower electrode 290 that is exposed by the pixel defining layer 310. The light emitting layer 330 may have a multi-layered structure including an emission layer (EL), a hole injection layer (HIL), a hole transfer layer (HTL), an electron transfer layer (ETL), an electron injection layer (EIL), etc. The HIL, the HTL, the EL, the ETL, and the EIL may be sequentially disposed between the lower electrode 290 and the upper electrode 340. The EL of the light emitting layer 330 may be formed using at least one of light emitting materials capable of generating different colors of light (e.g., a red color of light, a blue color of light, and a green color of light, etc). In some example embodiments, the HIL, the HTL, the ETL, the EIL, etc except the EL may be disposed in the transparent region 35.

Alternatively, the EL of the light emitting layer 330 may generate white light by stacking a plurality of light emitting materials capable of generating different colors of light such as a red color of light, a green color of light, a blue color of light, etc. In this case, a color filter may be disposed on the light emitting layer 330 (e.g., the color filter overlaps the light emitting layer 330). The color filter may include at least one selected from a group consisting of a red color filter, a green color filter, and a blue color filter. Alternatively, the color filter may further include a yellow color filter, a cyan color filter, and a magenta color filter. The color filter may include a photosensitive resin (or color photoresist), etc.

The upper electrode 340 may be disposed on the pixel defining layer 310 and the light emitting layer 330, and may not be disposed in the transparent region 35. When the upper electrode 340 is not transparent, it is removed from the transparent region 35 to increase the overall transmissivity of the display device 100. The upper electrode 340 may include a conductor such as a metal, a metal alloy, metal nitride, conductive metal oxide, transparent conductive materials, etc. These may be used alone or in a suitable combination thereof. Alternatively, the upper electrode 340 may have a multi-layered structure having a plurality of layers.

The reflection pattern 370 may be disposed in the reflection region 30 above the upper electrode 340. The reflection pattern 370 may be disposed on a lower surface of the second substrate 350. The reflection pattern 370 may substantially surround the sub-pixel region 20 and the transparent region 35, and may be disposed on a lower surface of the second substrate 350. In addition, the reflection pattern 370 may have openings 395. The openings 395 may be located such that the openings 395 are formed in regions corresponding to the sub-pixel region 20 and the transparent region 35. The reflection pattern 370 may have a mesh shape that has the openings 395.

The reflection pattern 370 may include a first surface and a second surface that is opposite the first surface. The first surface of the reflection pattern 370 may be in contact with the second substrate 350, and the second surface of the reflection pattern 370 may be in contact with the transflective reflection pattern 390.

A light incident through the second substrate 350 from an outside of the display device 100 may be reflected from the first surface of the reflection pattern 370 such that an image of an object that is located in front of the display device 100 may be reflected on the first surface of the reflection pattern 370. In addition, light generated from the light emitting layer 330 of the display device 100 may pass through the opening 395 located in the sub-pixel region 20. Meanwhile, the camera module 400 that is positioned on the second surface of the display panel 200 may capture an image of an object that is located in front of the display device 100 via the openings 395 located in the transparent region 35.

The reflection pattern 370 may include a material that has relatively high reflective index. For example, the reflection pattern 370 may include gold (Au), silver (Ag), aluminum (Al), platinum (Pt), nickel (Ni), titanium (Ti), etc. Alternatively, the reflection pattern 370 may be formed of a metal, a metal alloy, metal nitride, conductive metal oxide, transparent conductive materials, etc. Alternatively, the reflection pattern 370 may be formed of a metal, a metal alloy, metal nitride, conductive metal oxide, transparent conductive materials, etc.

In example embodiments, the reflection pattern 370 of the display device 100 includes a single layer. However, this is not a limitation of the inventive concept. For example, in some example embodiments, the reflection pattern 370 may have a multi-layered structure having a plurality of layers.

The transflective reflection pattern 390 may cover the second substrate 350 and the reflection pattern 370 on the second substrate 350, and may be disposed on the entire lower surface of the second substrate 350. That is, the reflection pattern 370 and the transflective reflection pattern 390 may be disposed between the second substrate 350 and the sub-pixel structure, and the reflection pattern 370 may be interposed between the second substrate 350 and the transflective reflection pattern 390. The transflective reflection pattern 390 may transmit a portion of light and may reflect a remaining portion of the light. For example, a thickness of the transflective reflection pattern 390 may be less than that of the reflection pattern 370, and a light transmissivity of the transflective reflection pattern 390 may be greater than that of the reflection pattern 370. In addition, the transflective reflection pattern 390 may prevent a diffraction phenomenon of light generated from the reflection pattern 370 having a plurality of openings 395. Accordingly, the display device 100 may serve as a mirror display device offering improved visibility of the display device 100.

In example embodiments, as illustrated in FIG. 7, the transflective reflection pattern 390 may have an opening 380 that exposes at least a portion of the transparent region 35 in the center region CP. In addition, as illustrated in FIG. 5, the transflective reflection pattern 390 may be disposed on the entire lower surface of the second substrate 350 in the peripheral region. For example, the camera module 400 may be positioned in the center region CP, and the camera module 400 that is positioned on the second surface of the display panel 200 may capture an image of an object that is located above the front of the display device 100 via the opening 380 that is located in the center region CP.

Meanwhile, when the opening 380 is not formed in the center region CP, the camera module 400 may capture an image of an object that is located in front of the display device 100 via the transflective reflection pattern 390. Here, a light transmissivity of a red color of light that has a wavelength of about 600 nanometers through the transflective reflection pattern 390 may be about 26 percents, and a light transmissivity of a green color of light that has a wavelength of about 525 nanometers through the transflective reflection pattern 390 may be about 45 percents. In addition, a light transmissivity of a blue color of light that has a wavelength of about 470 nanometers through the transflective reflection pattern 390 may be about 55 percents. Accordingly, since the blue color of light having a relatively high light transmissivity though the transflective reflection pattern 390 than the red and green color of light, the captured image may be entirely bluish having a low brightness. As a result, as the opening 380 is formed in the transflective reflection pattern 390 that is located in the transparent region 35 corresponding to a portion where the camera module 400 is positioned, the camera module 400 of the display device 100 may capture an image having improved visibility. In some example embodiments, as illustrated in FIG. 8, the opening 380 of the transflective reflection pattern 390 that is located in the center region CP may completely expose the transparent region 35. In this case, the camera module 400 of the display device 100 may capture an image having more improved visibility.

The transflective reflection pattern 390 may include Au, Ag, Al, Pt, Ni, Ti, etc. Alternatively, the transflective reflection pattern 390 may include a metal, a metal alloy, metal nitride, conductive metal oxide, transparent conductive materials, etc. For example, the transflective reflection pattern 390 may be formed of an alloy of aluminum, aluminum nitride (AlNx), an alloy of silver, tungsten nitride (WNx), an alloy of copper, chrome nitride (CrNx), an alloy of molybdenum, titanium nitride (TiNx), tantalum (Ta), tantalum nitride (TaNx), strontium ruthenium oxide (SRO), zinc oxide (ZnOx), stannum oxide (SnOx), indium oxide (InOx), gallium oxide (GaOx), indium tin oxide (ITO), indium zinc oxide (IZO), etc. These may be used alone or in a suitable combination thereof.

In example embodiments, the transflective reflection pattern 390 of the display device 100 may be a single layer. For example, in some example embodiments, the transflective reflection pattern 390 may have a multi-layered structure having a plurality of layers.

The second substrate 350 may be disposed on the reflection pattern 370 and the transflective reflection pattern 390. The second substrate 350 and the first substrate 110 may include substantially the same materials. For example, the second substrate 350 may include a quartz substrate, a synthetic quartz substrate, a calcium fluoride substrate, a fluoride-doped quartz substrate, a sodalime glass substrate, a non-alkali glass substrate, etc. In some example embodiments, the second substrate 350 may include a transparent inorganic material or a flexible plastic. For example, the second substrate 350 may include a flexible transparent resin substrate. In this case, to increase flexibility of the display device 100, the second substrate 350 may include a stacked structure where at least one organic layer and at least one inorganic layer are alternately stacked.

Referring again to FIGS. 1, 2, and 3, the camera module 400 may be positioned on the second surface of the display panel 200. For example, the display panel 200 may include the center region CP and the peripheral region surrounding the center region CP (refer to FIG. 4). The camera module 400 may be positioned in the center region CP or the peripheral region. In example embodiments, the camera module 400 may be positioned in the center region CP. The camera module 400 that is positioned on the second surface of the display panel 200 may capture an image of an object that is located in front of the first surface of the display panel 200 via the opening 380 of the transflective reflection pattern 390 that is disposed in the transparent region 35 of the display panel 200. That is, the camera module 400 may squarely capture the image of the object. For example, the position of eyes of a user of the display device 100 may exactly correspond to a position of the camera module 400, such that the user is "looking at" the camera. Alternatively, the display device 100 may further include a heat sink capable of releasing heat that is generated in the display panel 200, and the heat sink may be disposed between the display panel 200 and the camera module 400.

The body 300 may surround the display panel 200 and the camera module 400. The body 300 may include a front frame 300*a* (or an upper frame 300*a*) and a rear frame 300*b* (or a lower frame 300*b*). As the front frame 300*a* and the rear frame 300*b* are combined, the display device 100 including the display panel 200 and the camera module 400 may be provided. In example embodiments, the body 300 may fix the camera module 400 that is positioned in the second surface on the display panel 200. For example, the body 300 may have a protrusion portion 305 in a portion (e.g., in the lower frame 300*b*) where the camera module 400 is disposed. The front and rear frames 300*a* and 300*b* of the body 300 may protect the display panel 200, the camera module 400, etc. For example, when the display device 100 is used, the body 300 may absorb an impact to the display device 100 when the display device 100 is dropped or an external impact is applied thereto. The body 300 may include synthetic resin or metal (e.g., stainless steel, Ti, etc).

The display device 100 in accordance with example embodiments includes the reflection pattern 370 and the transflective reflection pattern 390 having the opening 380, the display panel 200 including the transparent window 385 in the transparent region 35, and the camera module 400 that is positioned on a second surface of the display panel 200, the display device 100 may reflect or capture an image of an object located in front of the display device 100. Accordingly, the display device 100 may squarely capture an image of an object located in front of the display device 100, and the camera module 400 of the display device 100 may capture an image having improved visibility via the opening 380 of the transflective reflection pattern 390.

FIGS. 9, 10, 11, 12, 13, 14, 15, 16, and 17 are cross-sectional views illustrating a method of manufacturing a display device in accordance with example embodiments.

Figure 9:
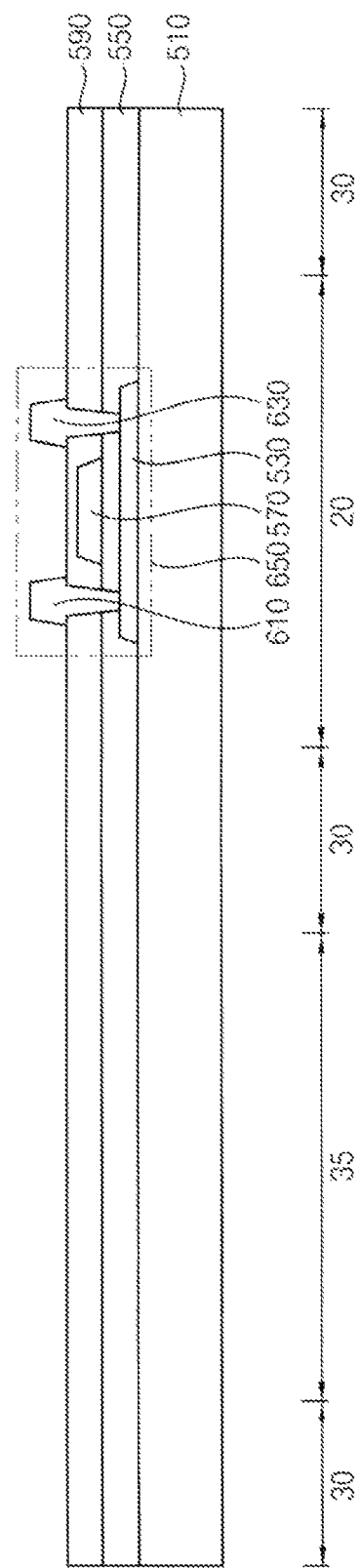
FIGS. 9, 10, 11, 12, 13, 14, 15, 16, and 17 are cross-sectional views illustrating a method of manufacturing a display device in accordance with example embodiments.

Referring to FIG. 9, a first substrate 510 may be provided. The first substrate 510 may be formed of one or more transparent materials. For example, the first substrate 510 may be formed using a quartz substrate, a synthetic quartz substrate, a calcium fluoride substrate, a fluoride-doped quartz substrate, a sodalime glass substrate, a non-alkali substrate etc. Alternatively, the first substrate 510 may be formed of a flexible transparent material such as a flexible transparent resin substrate (e.g., a polyimide substrate).

A buffer layer (not shown) may be formed on the first substrate 510. The buffer layer may be formed on the entire first substrate 510. The buffer layer may prevent the diffusion of metal atoms and/or impurities from the first substrate 510 into a sub-pixel structure. Additionally, the buffer layer may control heat conductivity in a crystallization process for forming an active layer, thereby obtaining a substantially uniform active layer. Furthermore, the buffer layer may improve a surface flatness of the first substrate 510 when a surface of the first substrate 510 is relatively irregular. For example, the buffer layer may be formed using organic materials or inorganic materials.

An active layer 530 may be formed in a sub-pixel region 20 on the first substrate 510, and may include source and drain regions. The active layer 530 may be formed using an oxide semiconductor, an inorganic semiconductor (e.g., amorphous silicon, polysilicon, etc.), an organic semiconductor, etc.

A gate insulation layer 550 may be formed on the active layer 530. The gate insulation layer 550 may cover the active layer 530 in the sub-pixel region 20 on the first substrate 510, and may be formed on the entire first substrate 510. In example embodiments, the gate insulation layer 550 may sufficiently cover the active layer 530 in the sub-pixel region 20, and may have a substantially even surface without a step around the active layer 530. Alternatively, the gate insulation layer 550 may cover the active layer 530 in the sub-pixel region 20, and may be formed to have a substantially uniform thickness along a profile of the active layer 530. The gate insulation layer 150 may be formed using a silicon compound, a metal oxide, etc.

A gate electrode 570 may be formed on the gate insulation layer 550 to overlap the active layer 530. The gate electrode 570 may be formed using a conductor such as a metal, a metal alloy, metal nitride, conductive metal oxide, transparent conductive materials, etc. These may be used alone or in a suitable combination thereof. Alternatively, the gate electrode 570 may have a multi-layered structure.

An insulating interlayer 590 may be formed on the gate electrode 570. The insulating interlayer 590 may cover the gate electrode 570 in the sub-pixel region 20 on the gate insulation layer 550, and may be formed on the entire gate insulation layer 550. In example embodiments, the insulating interlayer 590 may sufficiently cover the gate electrode 570 in the sub-pixel region 20, and may have a substantially even surface without a step around the gate electrode 570. Alternatively, the insulating interlayer 590 may cover the gate electrode 570 in the sub-pixel region 20, and may be formed to have a substantially uniform thickness along a profile of the gate electrode 570. The insulating interlayer 590 may be formed using a silicon compound, a metal oxide, etc.

A source electrode 610 and a drain electrode 630 may be formed in the sub-pixel region 20 on the insulating interlayer 590. The source electrode 610 may be in contact with the source region of the active layer 530 via a contact hole formed by removing a portion of the gate insulation layer 550 and the insulating interlayer 590. The drain electrode 630 may be in contact with a drain region of the active layer 530 via a contact hole formed by removing a portion of the gate insulation layer 550 and the insulating interlayer 590. Each of the source electrode 610 and the drain electrode 630 may be formed using a metal, an alloy, metal nitride, conductive metal oxide, transparent conductive materials, etc. These may be used alone or in a suitable combination thereof. Alternatively, each of the source electrode 610 and the drain electrode 630 may have a multi-layered structure. Accordingly, a semiconductor element 650 including the active layer 530, the gate insulation layer 550, the gate electrode 570, the insulating interlayer 590, the source electrode 610, and the drain electrode 630 may be formed.

Figure 10:
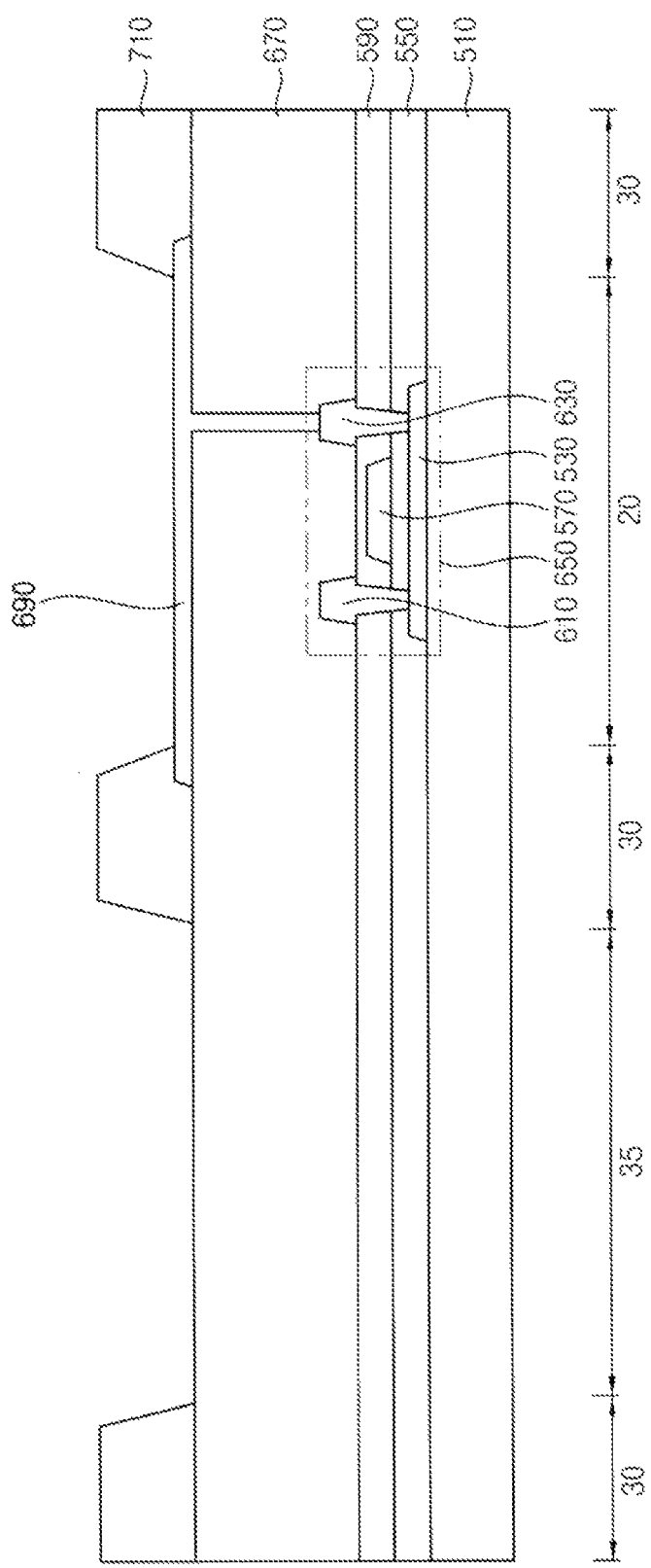

Referring to FIG. 10, a planarization layer 670 may be formed on the source electrode 610 and the drain electrode 630. The planarization layer 670 may cover the source electrode 610 and the drain electrode 630 in the sub-pixel region 20 on the insulating interlayer 590, and may be formed on the entire insulating interlayer 590. In example embodiments, the planarization layer 670 may be formed to have a thickness enough to sufficiently cover the source electrode 610 and the drain electrode 630 in the sub-pixel region 20. In this case, the planarization layer 670 may have a substantially even upper surface when it is formed, and a planarization process may be further performed on the planarization layer 670 to form the even upper surface when the planarization layer does not have a substantially even surface when it is formed. Alternatively, the planarization layer 670 may cover the source electrode 610 and the drain electrode 630 in the sub-pixel region 20, and may be formed as a substantially uniform thickness along a profile of the source electrode 610 and the drain electrode 630. The planarization layer 670 may include organic materials or inorganic materials. For example, the planarization layer 670 may be formed using inorganic materials such as SiOx, SiNx, SiOxNy, SiOxCy, SiCxNy, etc. Alternatively, the planarization layer 670 may be formed using organic materials such as a photoresist, a polyacryl-based resin, a polyimide-based resin, a polyamide-based resin, a siloxane-based resin, an acryl-based resin, an epoxy-based resin, etc.

A lower electrode 690 may be formed in the sub-pixel region 20 on the planarization layer 670. The lower electrode 690 may be in contact with the drain electrode 630 via a contact hole formed by removing a portion of the planarization layer 670. In addition, the lower electrode 690 may be electrically connected to the semiconductor element 650. The lower electrode 690 may be formed using a metal, a metal alloy, metal nitride, conductive metal oxide, transparent conductive materials, etc. These may be used alone or in a suitable combination thereof. Alternatively, the lower electrode 690 may have a multi-layered structure.

A pixel defining layer 710 may be formed in the reflection region 30 on the planarization layer 670, and may expose a portion of the lower electrode 690.

According to a first example embodiment, after the pixel defining layer 710 is formed, a transparent window 785 may be formed in the transparent region 35. The first substrate 510 may be exposed in the transparent region 35 by removing a portion of the gate insulation layer 550, the insulating interlayer 590, the planarization layer 670, and the pixel defining layer 710. A portion where the first substrate 510 is exposed in the transparent region 35 may be defined as the transparent window 785. The pixel defining layer 710 may be formed using organic materials or inorganic materials. Alternatively, after a preliminary pixel defining layer is formed on the substrate 510, the pixel defining layer 710 that exposes the transparent region 35 of the first substrate 510 and a portion of the lower electrode 690 may be formed by partially removing the preliminary pixel defining layer (e.g., a half tone silt mask process or exposure and development processes with photoresist). That is, the transparent window 785 and an opening exposing a portion of the lower electrode 690 may be simultaneously formed.

Figure 11:
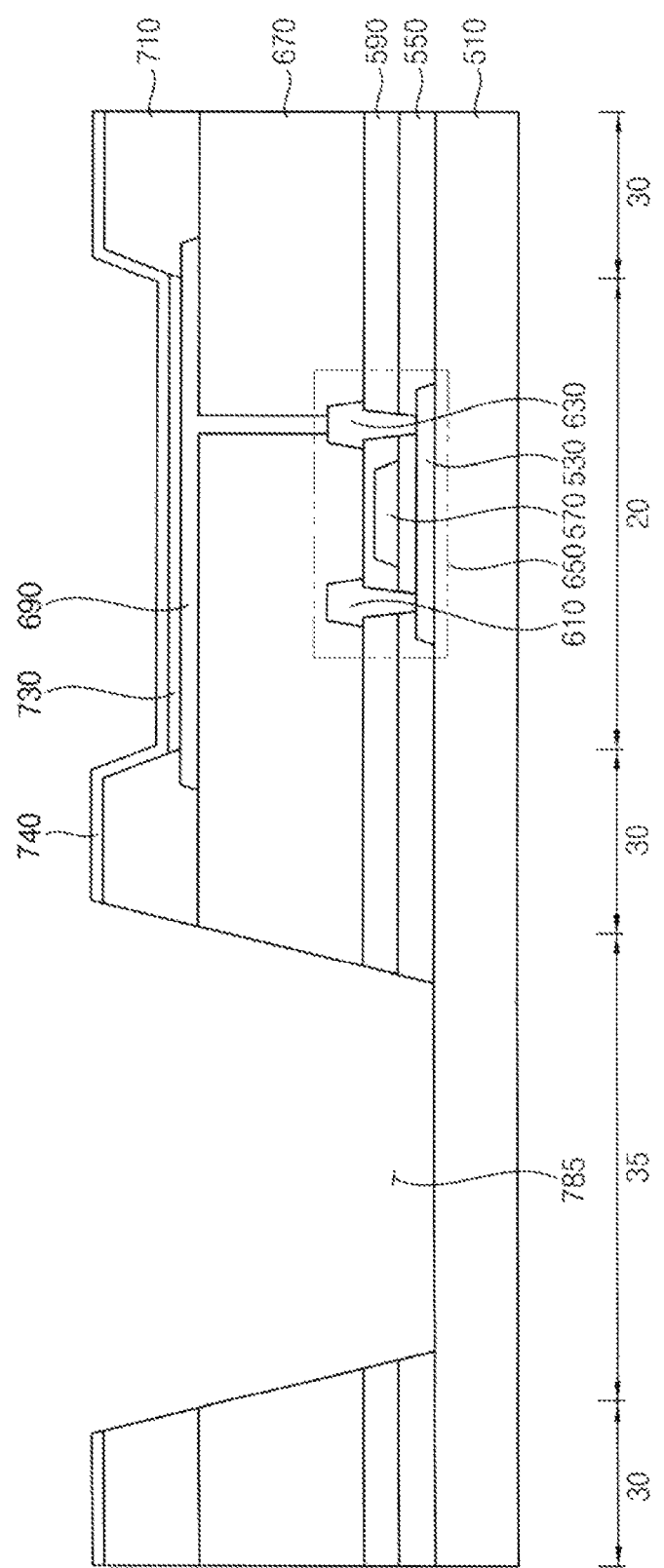

Referring to FIG. 11, a light emitting layer 730 may be formed on a portion of the lower electrode 690 that is exposed by the pixel defining layer 710. The light emitting layer 730 may have a multi-layered structure including an EL, an HIL, an HTL, an ETL, an EIL, etc. The HIL, the HTL, the EL, the ETL, and the EIL may be sequentially formed on the lower electrode 690. The EL of the light emitting layer 730 may be formed using at least one of light emitting materials capable of generating different colors of light (e.g., a red color of light, a blue color of light, and a green color of light, etc). In some example embodiments, the HIL, the HTL, the ETL, the EIL, etc except the EL may be formed in the transparent region 35.

Alternatively, the EL of the light emitting layer 330 may generate white light by stacking a plurality of light emitting materials capable of generating different colors of light such as a red color of light, a green color of light, a blue color of light, etc. In this case, a color filter may be disposed on the light emitting layer 730 (e.g., the color filter overlaps the light emitting layer 730). The color filter may include at least one selected from a group consisting of a red color filter, a green color filter, and a blue color filter. Alternatively, the color filter may further include a yellow color filter, a cyan color filter, and a magenta color filter. The color filter may include a photosensitive resin (or color photoresist), etc. An upper electrode 740 may be formed on the entire surface of the first substrate 510 including the pixel defining layer 710 and the light emitting layer 730. The upper electrode 740 in the transparent region 35 may be removed using a conventional photolithography technique.

In example embodiments, after the transparent window 785 is formed, an organic layer may be formed in the inside of the transparent window 785. When the organic layer is formed in the transparent window 725, the upper electrode 740 may not be formed in a region where the organic layer is formed in a process that the upper electrode 740 is formed. That is, a region where the upper electrode 740 is formed may be controlled by using the organic layer. The upper electrode 740 may cover the pixel defining layer 710 and the light emitting layer 730 except the transparent region 35, and may be formed on the entire first substrate 510. As the upper electrode 740 is not formed in the transparent region 35, a light transmissivity of the display device may be increased. The upper electrode 740 may be formed using a conductive layer such as a metal, a metal alloy, metal nitride, conductive metal oxide, transparent conductive materials, etc. These may be used alone or in a suitable combination thereof. In addition, the organic layer may include LiQ. The LiQ may have a low adhesive strength to a metal, and may be transparent.

According to a second example embodiment, after the pixel defining layer 710 is formed, the light emitting layer 730 is formed on a portion of the lower electrode 690 that is exposed by the pixel defining layer 710. The light emitting layer 730 may have a multi-layered structure including an EL, an HIL, an HTL, an ETL, an EIL, etc. The HIL, the HTL, the EL, the ETL, and the EIL may be sequentially formed on the lower electrode 690. The EL of the light emitting layer 730 may be formed using at least one of light emitting materials capable of generating different colors of light (e.g., a red color of light, a blue color of light, and a green color of light, etc.). In some example embodiments, the HIL, the HTL, the ETL, the EIL, etc. except the EL may be formed in the transparent region 35.

Alternatively, the EL of the light emitting layer 330 may generate white light by stacking a plurality of light emitting materials capable of generating different colors of light such as a red color of light, a green color of light, a blue color of light, etc. In this case, a color filter may be disposed on the light emitting layer 730 (e.g., the color filter overlaps the light emitting layer 730). The color filter may include at least one selected from a group consisting of a red color filter, a green color filter, and a blue color filter. Alternatively, the color filter may further include a yellow color filter, a cyan color filter, and a magenta color filter. The color filter may include a photosensitive resin (or color photoresist), etc.

An upper electrode forming material is formed on the entire surface of the first substrate 510 including the pixel defining layer 710 and the light emitting layer 730. The upper electrode forming material in the transparent window 785 is removed using a conventional photolithograph technique. After removing the upper electrode 740 in the transparent window 785, the planarization layer 670, the insulating interlayer 590 and the gate insulation layer 550 in the transparent region 785 may be sequentially removed.

Figure 12:
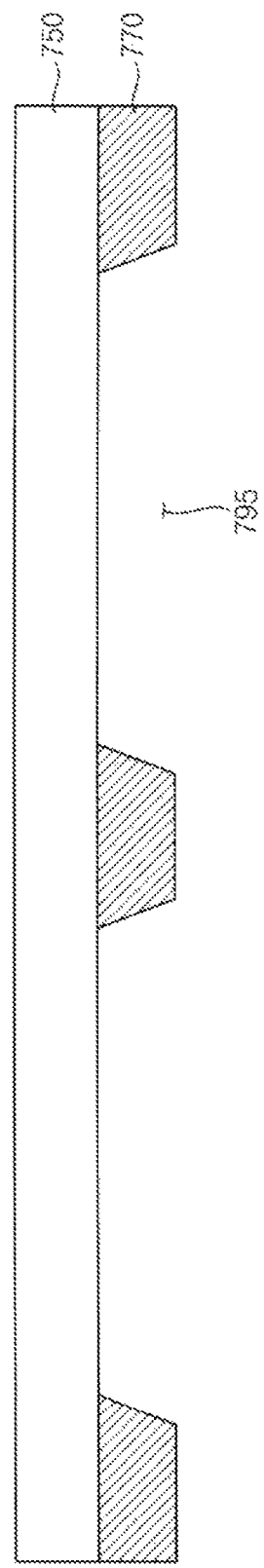

Referring to FIG. 12, a second substrate 750 may be provided. The second substrate 750 and the first substrate 510 may include substantially the same materials. In some example embodiments, the second substrate 750 may include a transparent inorganic material or flexible plastic. For example, the second substrate 750 may include a flexible transparent resin substrate. In this case, to increase flexibility of the display device, the second substrate 750 may include a stacked structure where at least one organic layer and at least one inorganic layer are alternately stacked.

A reflection pattern 770 may be formed on a lower surface of the second substrate 750. The reflection pattern 770 may include a first surface and a second surface that is opposite to the first surface. The first surface of the reflection pattern 770 may be in contact with the second substrate 750, and the second surface of the reflection pattern 770 may be in contact with the transflective reflection pattern that will be illustrated below. A light incident through the second substrate 750 from an outside of the display device 100 may be reflected from the first surface of the reflection pattern 770, and a light generated from the light emitting layer 730 of the display device may pass through the opening 795 located in regions corresponding to the sub-pixel region 20. Meanwhile, the camera module that will be described below may capture an image of an object that is located in the front of the display device via the openings 795 located in regions corresponding to the transparent region 35. The reflection pattern 770 may include a material that has relatively high reflective index. For example, the reflection pattern 770 may be formed using Au, Ag, Al, Pt, Ni, Ti, etc. Alternatively, the reflection pattern 770 may be formed using a metal, a metal alloy, metal nitride, conductive metal oxide, transparent conductive materials, etc.

Figure 13:
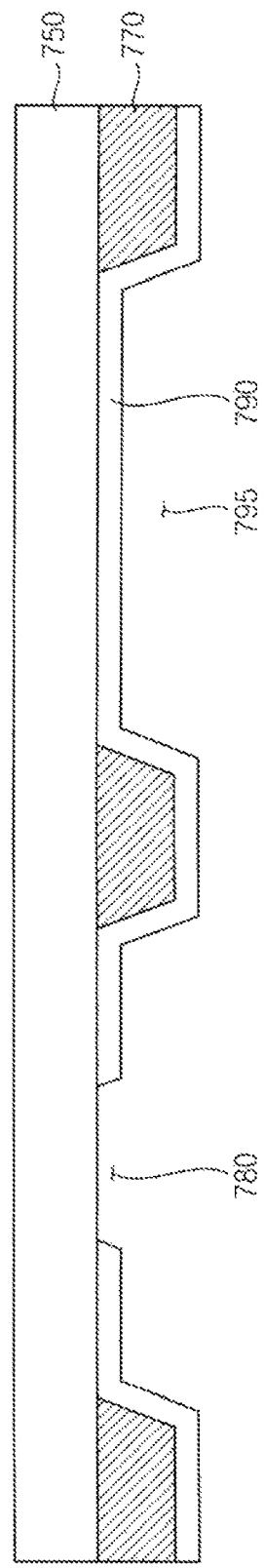
Figure 14:
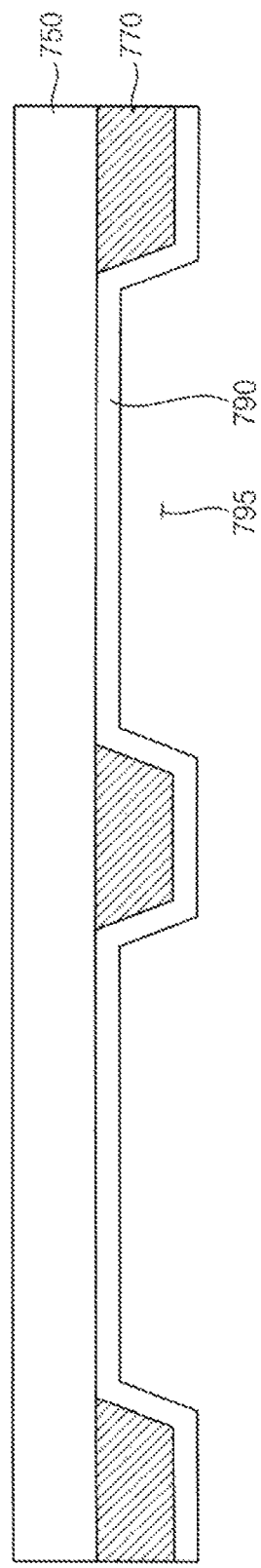

Referring to FIGS. 13 and 14, a transflective reflection pattern 790 may cover the second substrate 750 and the reflection pattern 770 on the second substrate 750, and may be entirely formed on a lower surface of the second substrate 750. The transflective reflection pattern 790 may transmit a portion of light and may reflect a remaining portion of the light. For example, a thickness of the transflective reflection pattern 790 may be less than that of the reflection pattern 770, and a light transmissivity of the transflective reflection pattern 790 may be greater than that of the reflection pattern 770. In addition, the transflective reflection pattern 790 may prevent a diffraction phenomenon of light generated from the reflection pattern 770 having a plurality of openings 795. Accordingly, the display device may serve as a mirror display device that visibility of the display device is relatively improved.

In example embodiments, as illustrated in FIG. 13, the transflective reflection pattern 790 may have an opening 780 that is exposes at least a portion of the transparent region 35 in a center region CP (refer to FIG. 4). In addition, as illustrated in FIG. 14, the transflective reflection pattern 790 may be formed on the entire lower surface of the second substrate 750 in a peripheral region. For example, the camera module that will be illustrated below may be positioned in the center region CP, and the camera module may capture an image of an object that is located in front of the display device via the opening 780 that is located in the center region CP.

For example, the transflective reflection pattern 790 may be formed using Au, Ag, Al, Pt, Ni, Ti, etc. Alternatively, the transflective reflection pattern 790 may be formed using a metal, a metal alloy, metal nitride, conductive metal oxide, transparent conductive materials, etc. For example, the transflective reflection pattern 790 may be formed of an alloy of aluminum, AlNx, an alloy of silver, WNx, an alloy of copper, CrNx, an alloy of molybdenum, TiNx, Ta, TaNx, SRO, ZnOx, SnOx, InOx, GaOx, ITO, IZO, etc. These may be used alone or in a suitable combination.

Figure 15:
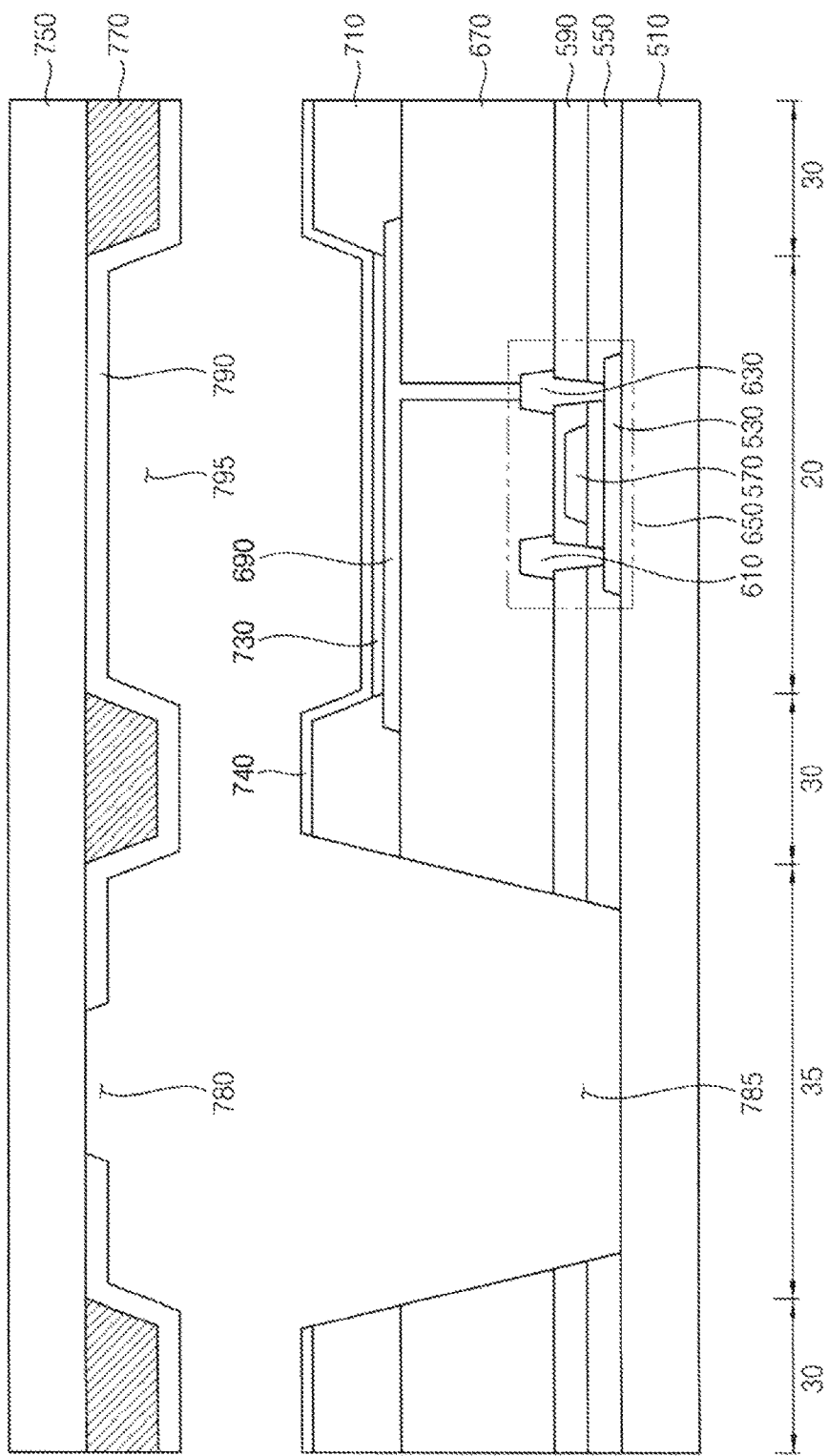

Referring to FIG. 15, the second substrate 750 including the transflective reflection pattern 790 and the reflection pattern 770 may be combined with the first substrate 510. A sealing process may be performed to combine the first substrate 510 with the second substrate 750. In this case, a sealant may be interposed in both lateral portions between the first substrate 510 and the second substrate 750. The sealant may include a frit, etc. The first substrate 510 and the second substrate 750 may be combined to each other through a laser irradiation. Here, the laser may be irradiated into the sealant. In the laser irradiation process, a phase of the sealant may be changed from a solid phase to a liquid phase. Then, the sealant having the liquid phase may be cured so that the sealant may have the solid phase again after a predetermined time. In accordance with the phase change of the sealant, the substrate 510 may be combined with the second substrate 750. The sealant disposed between the first substrate 510 and the second substrate 750 may protect the display device from permeation of water, moisture, oxygen, etc. The display device may not be deteriorated by the water, the moisture, the oxygen, etc. Accordingly, a display panel 600 may be formed.

Figure 16:
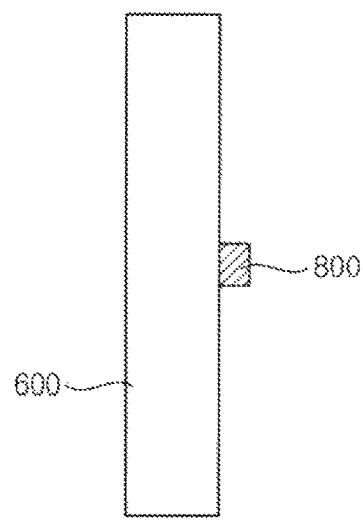

Referring to FIG. 16, a first surface (e.g., the front of the display device) of the display panel 600 may display an image, and a second surface, which is opposite to the first surface, of the display panel 600 may be in contact with a camera module 800. For example, the display panel 600 may include the center region CP and the peripheral region surrounding the center region CP (refer to FIG. 4). The camera module 400 may be positioned in the center region CP or the peripheral region. In example embodiments, the camera module 400 may be positioned in the center region CP. The camera module 800 may obtain an image of an object that is located in front of the first surface of the display panel 600 via the opening 780 of the transflective reflection pattern 790 that is formed in the transparent region 35 of the display panel 600. That is, the camera module 800 may squarely capture the image of the object. For example, the position of eyes of a user of the display device may exactly correspond to a position of the camera module 800.

Figure 17:
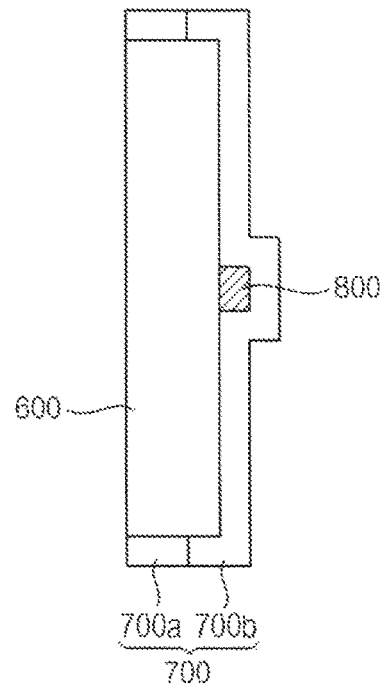

Referring to FIG. 17, the body 700 may surround the display panel 600 and the camera module 800. The body 700 may include an upper frame 700a and a lower frame 700b. As the upper frame 700a and the lower frame 700b are combined, the display device including the display panel 600 and the camera module 800 may be provided. In example embodiments, the body 700 may fix the camera module 400 that is positioned in the second surface on the display panel 600. For example, the body 700 may have a protrusion portion in a portion (e.g., in the lower frame 700b) where the camera module 800 is disposed. The front and back frames 700a and 700b of the body 700 may protect the display panel 600, the camera module 800, etc. The body 700 may be formed using synthetic resin or metal (e.g., stainless steel, Ti, etc). Accordingly, the display device 100 illustrated in FIG. 3 may be provided.

Figure 18:
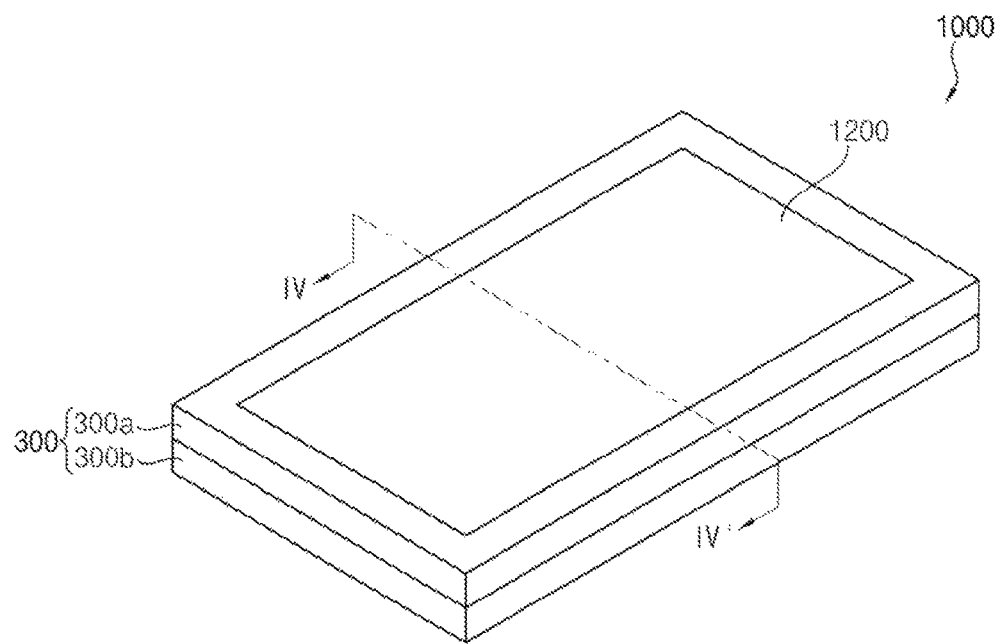
FIG. 18 is a perspective view illustrating a display device in accordance with example embodiments.
Figure 19:
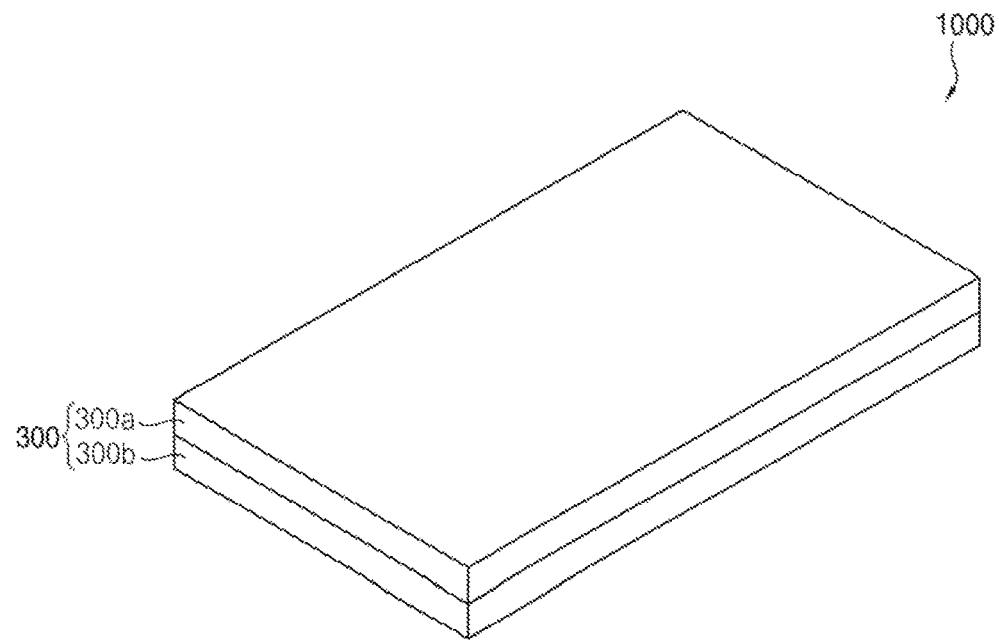
FIG. 19 is a perspective view illustrating a lower surface of the display device of FIG. 18.
Figure 20:
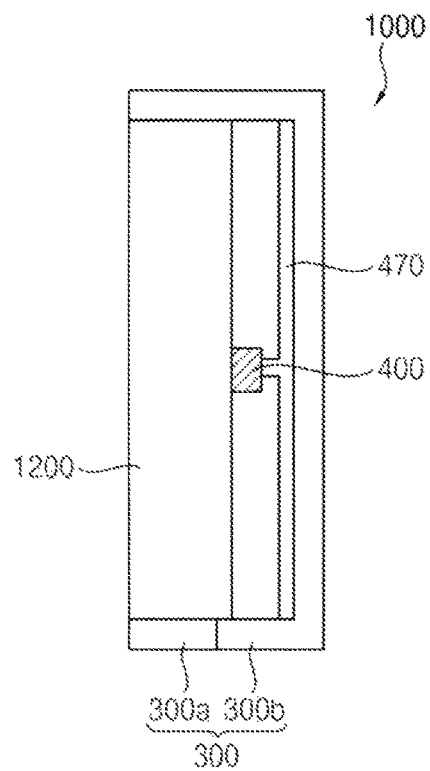
FIG. 20 is a cross-sectional view taken along a line IV-IV' of FIG. 18.
Figure 21:
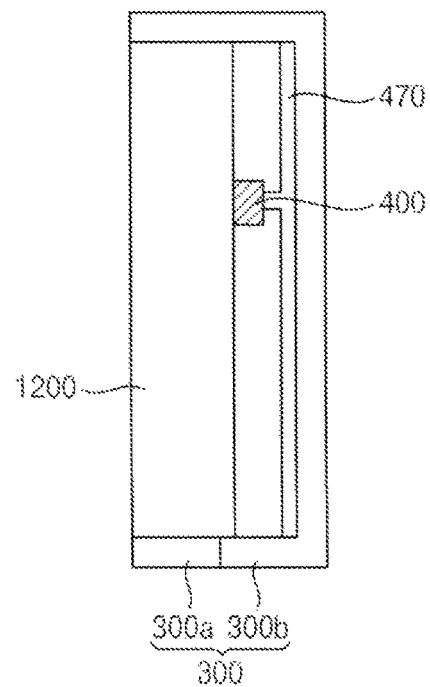
FIG. 21 is a cross-sectional view for describing a moving member included in the display device of FIG. 20.
Figure 22:
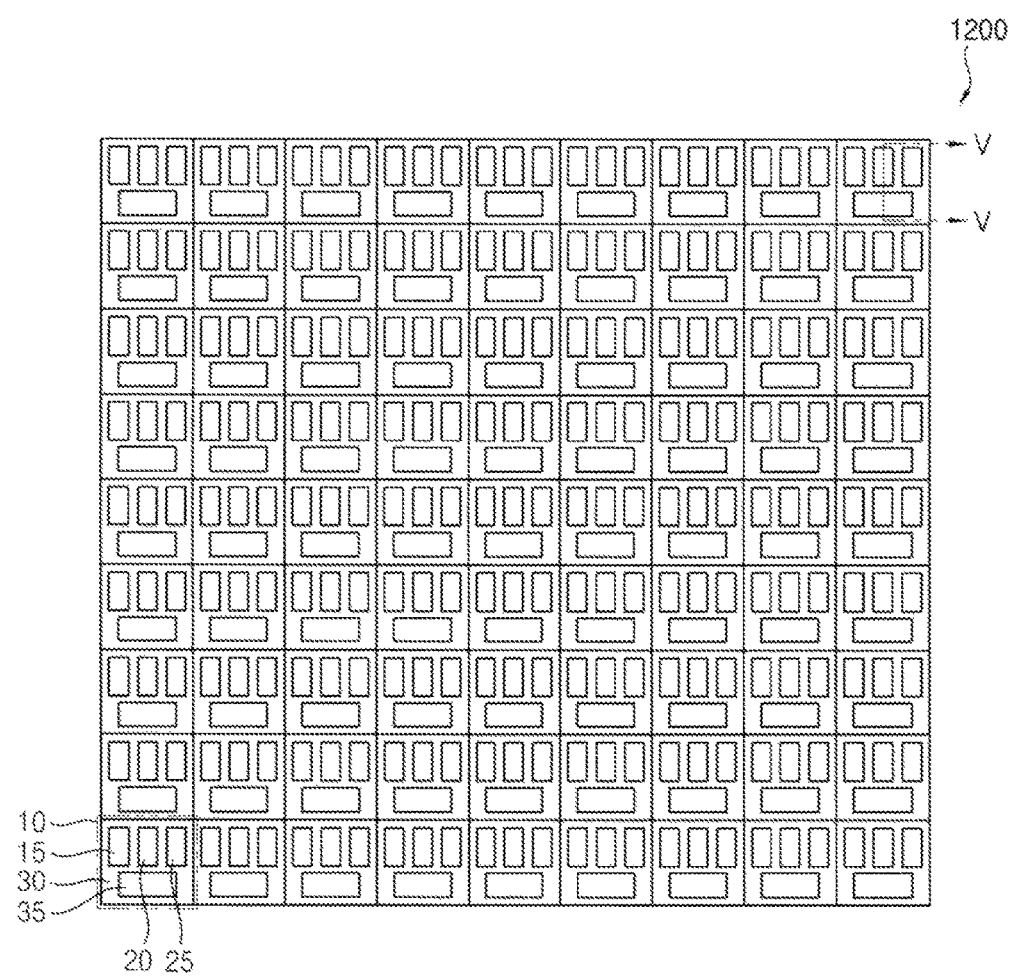
FIG. 22 is a planar view for describing a display panel included in the display device of FIG. 20.
Figure 23:
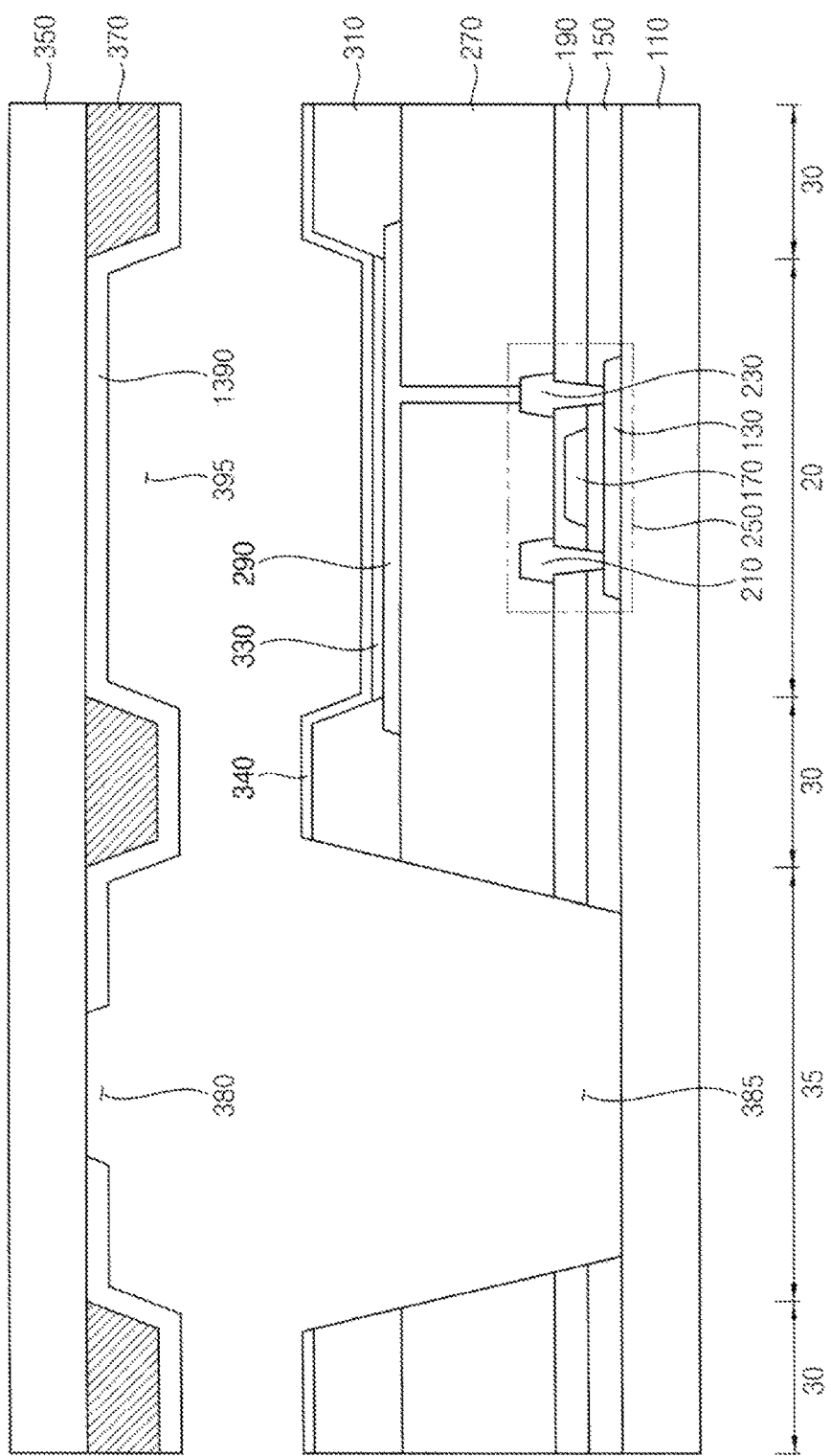
FIG. 23 is a cross-sectional view taken along a line V-V' of FIG. 22.

FIG. 18 is a perspective view illustrating a display device in accordance with example embodiments, and FIG. 19 is a perspective view illustrating a lower surface of the display device of FIG. 18. FIG. 20 is a cross-sectional view take along a line IV-IV' of FIG. 18, and FIG. 21 is a cross-sectional view for describing a moving member included in the display device of FIG. 20. FIG. 22 is a planar view for describing a display panel included in the display device of FIG. 20, and FIG. 23 is a cross-sectional view taken along a line V-V' of FIG. 22.

A display device 1000 illustrated in FIGS. 18, 19, 20, 21, 22 and 23 may have a configuration substantially the same as or similar to that of a display device 100 described with reference to FIGS. 1, 2, 3, 4, 5, 6, and 7 except a moving member 470 and a display panel 1200. In FIGS. 18, 19, 20, 21, 22 and 23, detailed descriptions for elements that are substantially the same as or similar to elements described with reference to FIGS. 1, 2, 3, 4, 5, 6, and 7 may not be repeated.

Referring to FIGS. 18, 19, 20, 21, 22, and 23, a display device 1000 may include a display panel 1200, a camera module 400, a body 300, a moving member 470, etc. Here, the display panel 1200 may include a first substrate 110, a sub-pixel structure, a second substrate 350, a reflection pattern 370, a transflective reflection pattern 1390, etc. In example embodiments, the display panel 200 may include a plurality of pixel regions 10. One pixel region 10 among a plurality of the pixel regions 10 may include first, second, and third sub-pixel regions 15, 20, and 25, a transparent region 35, and a reflection region 30. Here, the transflective reflection pattern 1390 may have an opening that exposes at least a portion of the transparent region 35.

As the display device 1000 includes the reflection region 30, the display device 1000 may reflect an image of an object that is located in front of the display device 1000. In addition, as the display device 1000 includes the transparent region 35, the camera module 400 may obtain (or, film) an image of an object that is located in front of the display device 1000 via the transparent region 35. Further, as the display device 1000 includes the moving member 470, the moving member 470 may move the camera module 400 such that the camera module 400 is positioned in a predetermined region on a lower surface of the display panel 1200.

Referring again to FIGS. 20, 21, 22, and 23, a first surface (e.g., the front of the display device 1000) of the display panel 1200 may display an image, and a second surface of the display panel 1200, which is opposite to the first surface, may be in contact with the camera module 400.

In example embodiments, as illustrated in FIGS. 22 and 23, the transflective reflection pattern 1390 included in the display panel 1200 may have an opening 380 that exposes at least a portion of a plurality of transparent regions 35.

The camera module 400 may be positioned on the second surface of the display panel 1200. The camera module 400 may capture an image of an object that is in front of the first surface of the display panel 1200 via the transparent region 35 of the display panel 1200. The camera module 400 may be moved to a region corresponding to an object to be captured using the moving member 470. Thus, the camera module 400 may squarely capture the image of the object.

The body 300 may surround the display panel 1200, the camera module 400, and the moving member 470. The body 300 may include a front frame 300a and a rear frame 300b. As the front frame 300a and the rear frame 300b are combined, the display device 1000 including the display panel 1200, the camera module 400, and the moving member 470 may be provided. In example embodiments, the rear frame 300b may fix the moving member 470. The front and rear frames 300a and 300b of the body 300 may protect the display panel 1200, the camera module 400, the moving member 470, etc. The body 300 may include synthetic resin or metal (e.g., stainless steel, Ti, etc).

The moving member 470 may be disposed on the camera module 400 that is positioned on the second surface of the display panel 1200. For example, the moving member 470 may include a rail/groove formed in a grid configuration that is parallel to the display panel 1200. The moving member 470 may be coupled to the camera module 400 such that the camera module 400 may be moved between the display panel 1200 and the moving member 470, for example by sliding through the rail/groove. As illustrated in FIG. 20, the camera module 400 may be positioned in the center region of the display panel 1200, or as illustrated in FIG. 21, the camera module 400 may be positioned in the peripheral region. That is, the display device 1000 may move the camera module 400 using the moving member 470 such that a position of the camera module 400 may be moved to a region corresponding to an object that is located in front of the first surface of the display panel 1200. Accordingly, although the position of the object that is located in front of the first surface of the display panel 1200 is changed, the camera module 400 may squarely capture an image of the object by moving the camera module 400 using the moving member 470 such that the camera module 400 corresponds to the position of the object. In this case, the transflective reflection pattern 1390 included in the display panel 1200 may have an opening 380 that exposes at least a portion of a plurality of the transparent regions 35.

Figure 24:
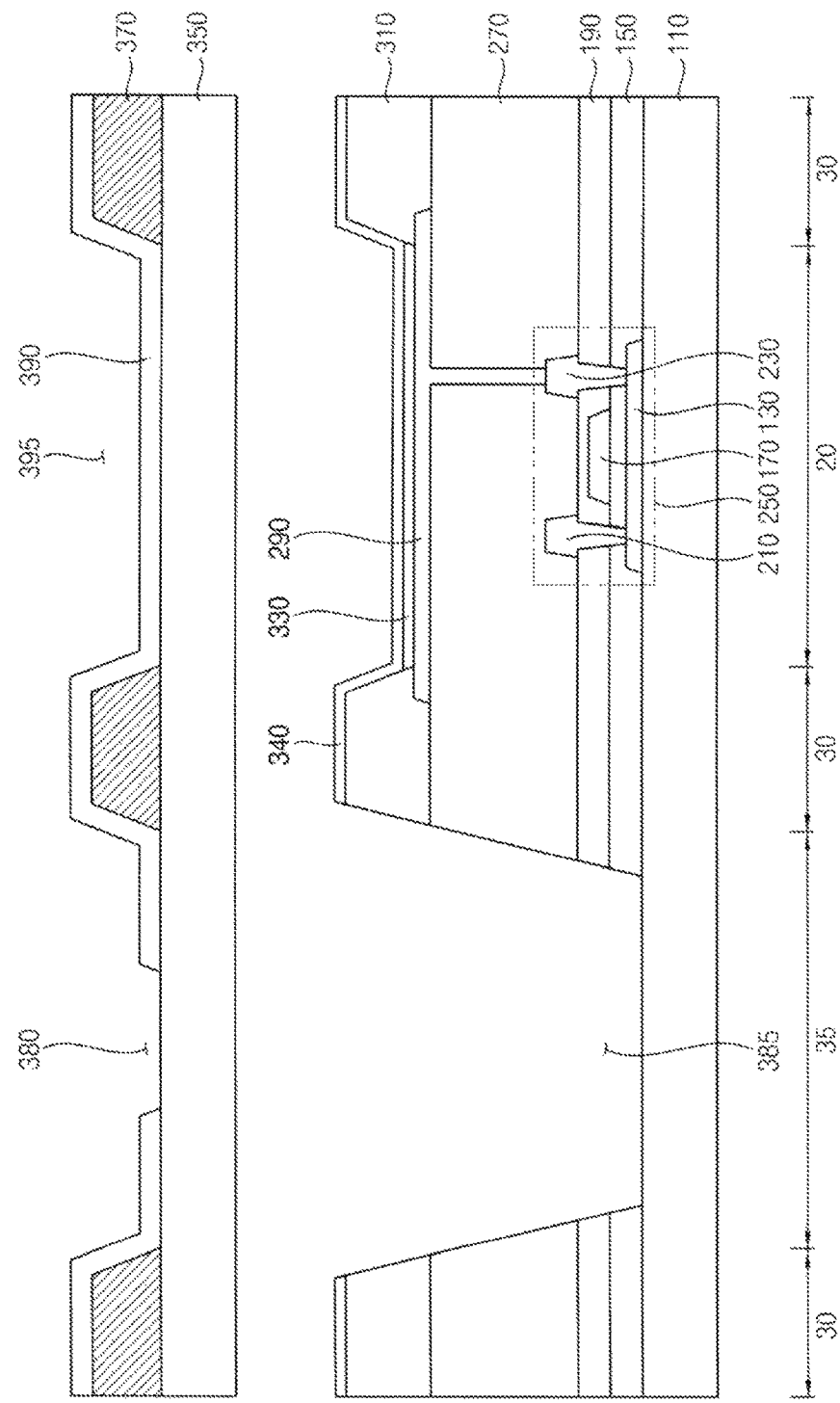
FIG. 24 is a cross-sectional view illustrating an example of a display panel included in the display device of FIG. 1.
Figure 25:
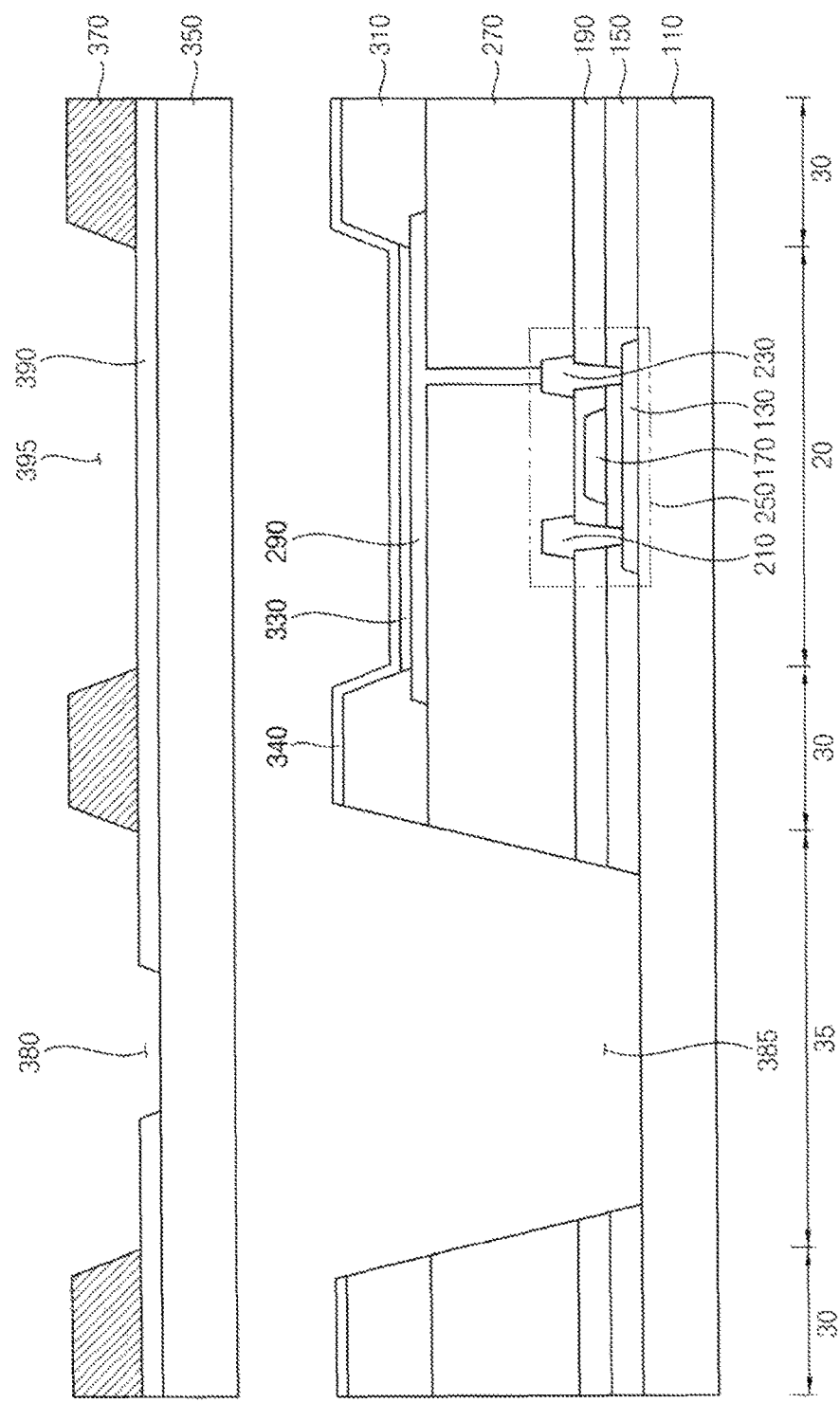
FIG. 25 is a cross-sectional view illustrating an example of a display panel included in the display device of FIG. 1.
Figure 26:
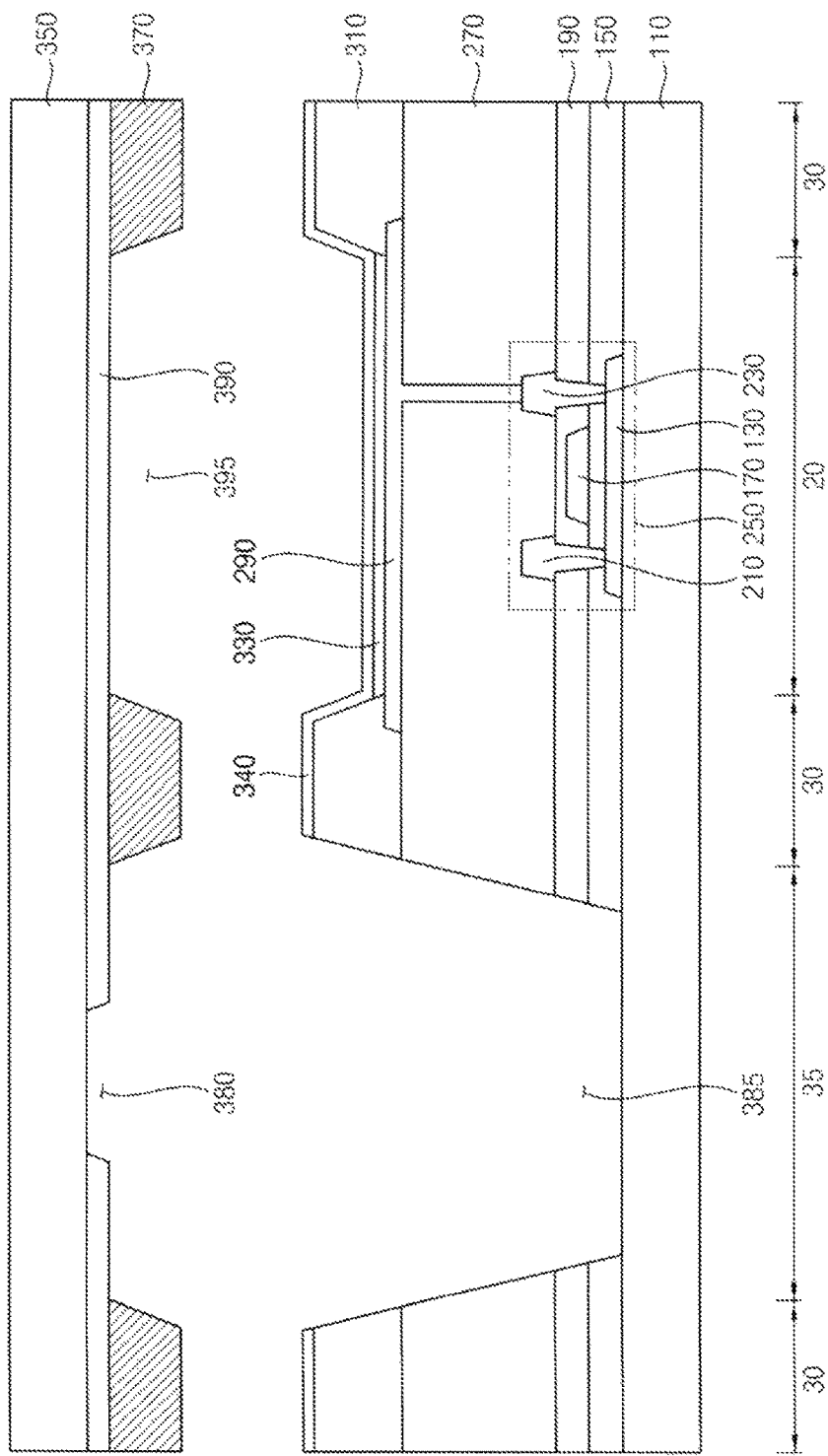
FIG. 26 is a cross-sectional view illustrating an example of a display panel included in the display device of FIG. 1.

FIG. 24 is a cross-sectional view illustrating an example of a display panel included in the display device of FIG. 1, and FIG. 25 is a cross-sectional view illustrating an example of a display panel included in the display device of FIG. 1. FIG. 26 is a cross-sectional view illustrating an example of a display panel included in the display device of FIG. 1. Display panels included in display devices illustrated in FIGS. 24, 25, and 26 may have a configuration substantially the same as or similar to that of a display panel 200 included in a display device 100 described with reference to FIGS. 1, 2, 3, 4, 5, 6, and 7 except a position of a reflection pattern 370 and a position of a transflective reflection pattern 390. In FIGS. 24, 25, and 26, detailed descriptions for elements that are substantially the same as or similar to elements described with reference to FIGS. 1, 2, 3, 4, 5, 6, and 7 may not be repeated.

Referring to FIG. 24, the reflection pattern 370 may be disposed in the reflection region 30 on the second substrate 350. That is, the reflection pattern 370 may be disposed on an upper surface of the second substrate 350.

The transflective reflection pattern 390 may cover the second substrate 350 and the reflection pattern 370 on the second substrate 350, and may be disposed on the entire upper surface of the second substrate 350. In example embodiments, the transflective reflection pattern 390 may have an opening 380 that is exposes at least a portion of the transparent region 35 in the center region CP. In addition, the transflective reflection pattern 390 may be disposed on the entire upper surface of the second substrate 350 in the peripheral region. That is, the reflection pattern 370 may be disposed between the second substrate 350 and the transflective reflection pattern 390.

Referring to FIG. 25, the transflective reflection pattern 390 may be disposed on the entire second substrate 350. In example embodiments, the transflective reflection pattern 390 may have an opening 380 that is exposes at least a portion of the transparent region 35 in the center region CP. In addition, the transflective reflection pattern 390 may be disposed on the entire upper surface of the second substrate 350 in the peripheral region.

That is, the reflection pattern 370 may be disposed between the second substrate 350 and the transflective reflection pattern 390.

The reflection pattern 370 may be disposed in the reflection region 30 on the transflective reflection pattern 390. That is, the transflective reflection pattern 390 may be disposed between the second substrate 350 and the reflection pattern 370.

Referring to FIG. 26, the reflection pattern 370 and the transflective reflection pattern 390 may be disposed between the second substrate 350 and the sub-pixel structure. The transflective reflection pattern 390 may be disposed on a lower surface of the second substrate 350, and may be disposed on the entire lower surface of the second substrate 350. In example embodiments, the transflective reflection pattern 390 may have an opening 380 that is exposes at least a portion of the transparent region 35 in the center region CP. In addition, the transflective reflection pattern 390 may be disposed on the entire lower surface of the second substrate 350 in the peripheral region.

The reflection pattern 370 may be disposed on a lower surface of the transflective reflection pattern 390. That is, the transflective reflection pattern 390 may be disposed between the reflection pattern 370 and the second substrate 350.

Figure 27:
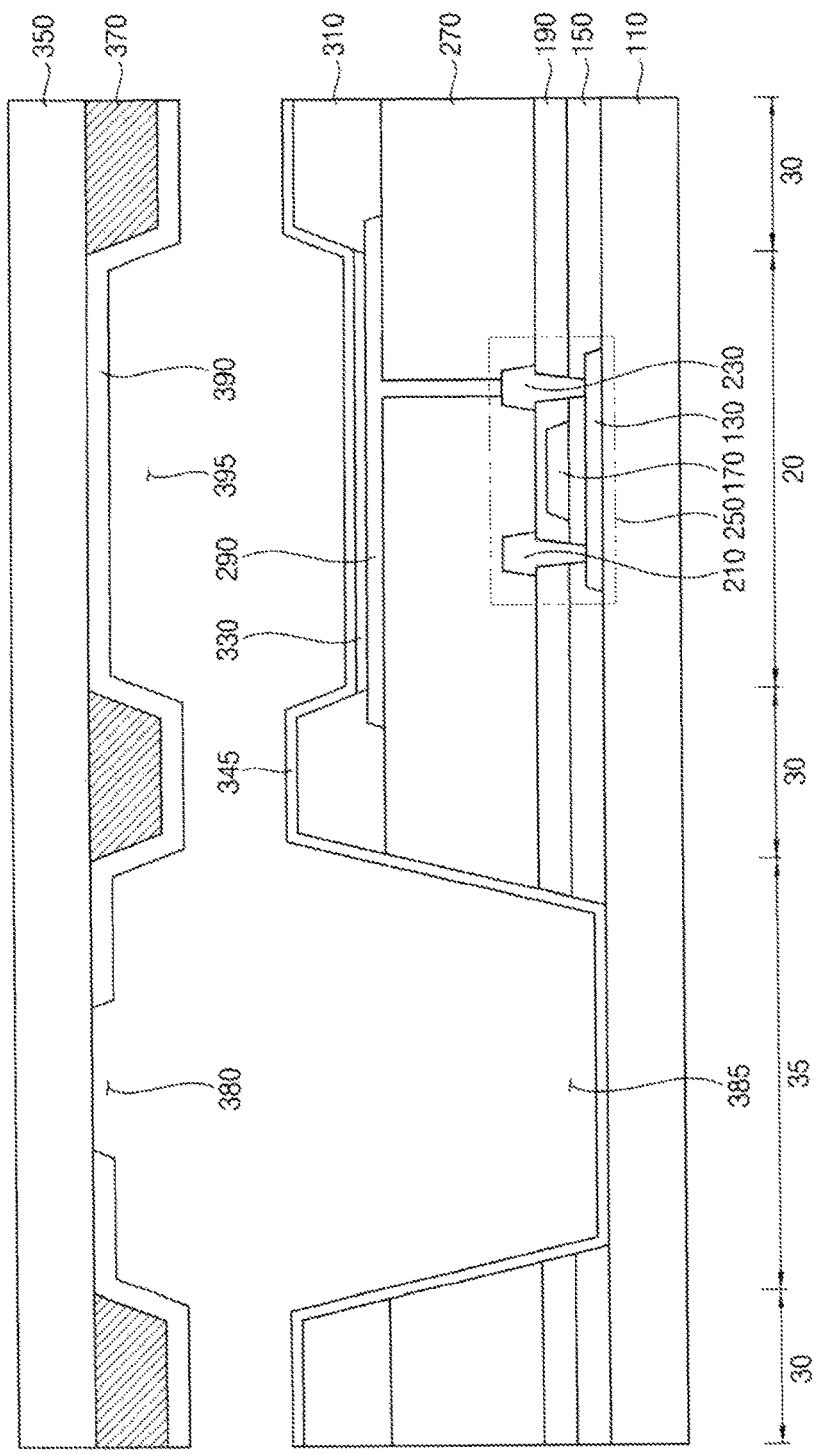
FIG. 27 is a cross-sectional view illustrating an example of a display panel included in the display device of FIG. 1.
Figure 28:
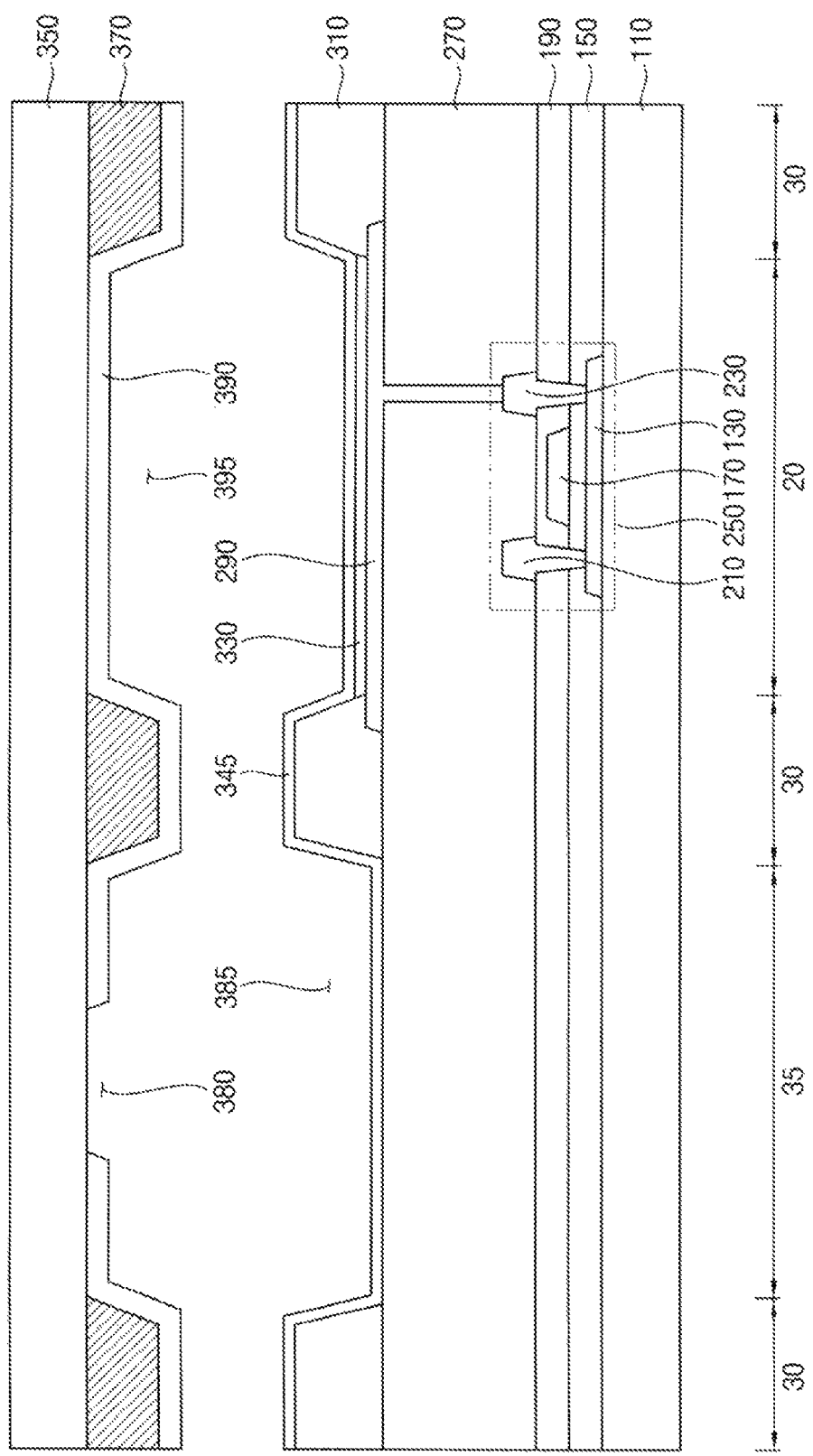
FIG. 28 is a cross-sectional view illustrating an example of a display panel included in the display device of FIG. 1.

FIG. 27 is a cross-sectional view illustrating an example of a display panel included in the display device of FIG. 1, and FIG. 28 is a cross-sectional view illustrating an example of a display panel included in the display device of FIG. 1. Display panels included in a display device illustrated in FIGS. 27 and 28 may have a configuration substantially the same as or similar to that of a display panel 200 included in a display device 100 described with reference to FIGS. 1, 2, 3, 4, 5, 6, and 7 except for the shape of an upper electrode 345 or a shape of insulation layers. In FIGS. 27 and 28, detailed descriptions for elements that are substantially the same as or similar to elements described with reference to FIGS. 1, 2, 3, 4, 5, 6, and 7 may not be repeated.

Referring to FIG. 27, the upper electrode 345 may be disposed on the pixel defining layer 310 and the light emitting layer 330, and may be disposed in the transparent region 35. That is, the upper electrode 345 may be disposed on the entire first substrate 110.

Referring to FIG. 28, the gate insulation layer 150 may be disposed on the active layer 130. The gate insulation layer 150 may cover the active layer 130 in the sub-pixel region 20 on the first substrate 110, and may be disposed in the transparent region 35. That is, the gate insulation layer 150 may be disposed on the entire first substrate 110.

The insulating interlayer 190 may be disposed on the gate electrode 170. The insulating interlayer 190 may cover the gate electrode 170 in the sub-pixel region 20 on the gate insulation layer 150, and may be disposed in the transparent region 35. That is, the insulating interlayer 190 may be disposed on the entire first substrate 110.

The planarization layer 270 may be disposed on the source electrode 210 and the drain electrode 230. The planarization layer 270 may cover the source electrode 210 and the drain electrode 230 in the sub-pixel region 20 on the insulating interlayer 190, and may be disposed in the transparent region 35. That is, the planarization layer 270 may be disposed on the entire insulating interlayer 190.

The present inventive concept may be applied to various display devices including a display device. For example, the present inventive concept may be applied to vehicle-display device, a ship-display device, an aircraft-display device, portable communication devices, display devices for display or for information transfer, a medical-display device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display device, comprising:
    a display panel having a first surface and a second surface which is opposite to the first surface, the display panel displaying an image in the first surface, the display panel including:
    a first substrate including a plurality of pixel regions, each of the plurality of pixel regions having sub-pixel regions, a transparent region, a reflection region surrounding the sub-pixel regions and the transparent region, and a sub-pixel structure in each of the sub-pixel regions;
    a second substrate facing the first substrate a reflection pattern exposing the sub-pixel regions and the transparent region, and a transflective reflection pattern having an opening exposing at least a portion of the transparent region being disposed on the second substrate; and
    a camera module on the second surface of the display panel.

2. The display device of claim 1, wherein the transflective reflection pattern that is located in the transparent region corresponding to a portion where the camera module is positioned has an opening.

3. The display device of claim 1, wherein a thickness of the transflective reflection pattern is less than a thickness of the reflection pattern, and a light transmissivity of the transflective reflection pattern is greater than a light transmissivity of the reflection pattern.

4. The display device of claim 1, wherein the reflection pattern and the transflective reflection pattern are disposed between the second substrate and the sub-pixel structure, and the reflection pattern is interposed between the second substrate and the transflective reflection pattern.

5. The display device of claim 1, wherein the reflection pattern and the transflective reflection pattern are disposed between the second substrate and the sub-pixel structure, and the transflective reflection pattern is interposed between the second substrate and the reflection pattern.

6. The display device of claim 1, wherein the reflection pattern and the transflective reflection pattern are disposed on an upper surface of the second substrate which faces the first substrate, and the reflection is interposed between the second substrate and the transflective reflection pattern.

7. The display device of claim 1, wherein the reflection pattern and the transflective reflection pattern are disposed on an upper surface of the second substrate which faces the first substrate, and the transflective reflection pattern is interposed between the second substrate and the reflection pattern.

8. The display device of claim 1, wherein the display panel includes a center region and a peripheral region surrounding the center region, and
    wherein the camera module is disposed in the center region or the peripheral region.

9. The display device of claim 8, wherein the camera module is disposed in the center region, and the transflective reflection pattern that is located in the transparent regions corresponding to the center region has an opening that exposes at least a portion of the transparent regions.

10. The display device of claim 1, wherein the camera module captures an image of an object that is located in front of the first surface of the display panel via the transparent regions of the display panel.

11. The display device of claim 1, further comprising:
    a body surrounding the display panel and the camera module.

12. The display device of claim 11, wherein the body holds the camera module that is located in the second surface on the display panel.

13. The display device of claim 1, further comprising:
    a moving member coupled to the camera module, the moving member being configured to move the camera module on the second surface of the display panel.

14. The display device of claim 13, wherein the transflective reflection pattern has an opening that exposes at least a portion of the transparent regions.

15. The display device of claim 14, further comprising:
    a body surrounding the display panel, the camera module, and the moving member.

16. The display device of claim 1, wherein the sub-pixel structure includes:
    a semiconductor element on the first substrate;
    a lower electrode on the semiconductor element;
    a light emitting layer on the lower electrode; and
    an upper electrode on the light emitting layer.

17. The display device of claim 16, wherein the upper electrode exposes the transparent regions.

18. The display device of claim 17, wherein the semiconductor element includes:
- an active layer on the first substrate, the active layer including source and drain regions;
- a gate electrode on the active layer;
- a source electrode on the gate electrode, the source electrode being in contact with the source region of the active layer; and
- a drain electrode spaced apart from the source electrode, the drain electrode being in contact with the drain region of the active layer.

19. The display device of claim 18, wherein the semiconductor element further includes:
- a gate insulation layer on the first substrate, the gate insulation layer covering the active layer in the sub-pixel region and exposing the transparent regions;
- an insulating interlayer on the gate insulation layer, the insulating interlayer covering the gate electrode in the sub-pixel region and exposing the transparent regions; and
- a planarization layer on the insulating interlayer, the planarization layer covering the source and drain electrodes in the sub-pixel region and exposing the transparent regions.

20. The display device of claim 19, wherein a portion of the first substrate that is exposed by the gate insulation layer, the insulating interlayer, and the planarization layer in the transparent regions is defined as a transparent window of the transparent regions.

* * * * *